(12) United States Patent
Cha et al.

(10) Patent No.: US 10,671,478 B2
(45) Date of Patent: Jun. 2, 2020

(54) SCRUBBING CONTROLLERS OF SEMICONDUCTOR MEMORY DEVICES, SEMICONDUCTOR MEMORY DEVICES AND METHODS OF OPERATING THE SAME

(71) Applicant: SAMSUNG ELECTRONICS CO., LTD., Suwon-si, Gyeonggi-Do (KR)

(72) Inventors: Sang-Uhn Cha, Yongin-si (KR); Ye-Sin Ryu, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 267 days.

(21) Appl. No.: 15/693,673

(22) Filed: Sep. 1, 2017

(65) Prior Publication Data

US 2018/0150350 A1    May 31, 2018

(30) Foreign Application Priority Data

Nov. 28, 2016   (KR) .................. 10-2016-0159158

(51) Int. Cl.
*G06F 11/10* (2006.01)
*G11C 29/42* (2006.01)
(Continued)

(52) U.S. Cl.
CPC ........ *G06F 11/106* (2013.01); *G06F 11/1016* (2013.01); *G06F 3/0619* (2013.01);
(Continued)

(58) Field of Classification Search
CPC .. G06F 11/106; G06F 11/1068; G06F 3/0619; G06F 11/1048; G06F 11/1072;
(Continued)

(56) References Cited

U.S. PATENT DOCUMENTS 5,978,952 A    11/1999  Hayek et al.
9,021,337 B1*  4/2015   Northcott ............ G06F 11/1068
                                                          714/773

(Continued)

FOREIGN PATENT DOCUMENTS

KR    1020120136674    12/2012
KR    1020140147677    12/2014
KR    1020150058315    5/2015
KR    1020150119169    10/2015

*Primary Examiner* — Cynthia Britt
*Assistant Examiner* — Sazzad Hossain
(74) *Attorney, Agent, or Firm* — F. Chau & Associates, LLC

(57) ABSTRACT

A scrubbing controller of a semiconductor memory device includes a scrubbing address generator and a weak codeword address generator. The scrubbing address generator generates a scrubbing address for all codewords in a first bank array of a plurality of bank arrays in a first scrubbing mode. The scrubbing address is associated with a normal scrubbing operation and changes in response to an internal scrubbing signal and a scrubbing command. The weak codeword address generator generates a weak codeword address for weak codewords in the first bank array in a second scrubbing mode. The weak codeword address is associated with a weak scrubbing operation and is generated in response to the internal scrubbing signal.

20 Claims, 21 Drawing Sheets

(51) Int. Cl.
*G06F 11/07* (2006.01)
*G11C 29/44* (2006.01)
*G06F 3/06* (2006.01)
*G11C 29/52* (2006.01)
*G11C 13/00* (2006.01)
*G06F 12/02* (2006.01)

(52) U.S. Cl.
CPC ........ *G06F 11/076* (2013.01); *G06F 11/0751* (2013.01); *G06F 11/0772* (2013.01); *G06F 11/1068* (2013.01); *G06F 11/1072* (2013.01); *G06F 12/0246* (2013.01); *G06F 2211/1088* (2013.01); *G11C 13/0033* (2013.01); *G11C 29/42* (2013.01); *G11C 29/44* (2013.01); *G11C 29/52* (2013.01)

(58) Field of Classification Search
CPC ............... G06F 12/0246; G06F 11/076; G06F 11/0751; G06F 2211/1088; G06F 11/0772; G06F 11/1016; G11C 29/52; G11C 29/44; G11C 29/42; G11C 13/0033
See application file for complete search history.

(56) References Cited

U.S. PATENT DOCUMENTS

| | | | |
|---|---|---|---|
| 9,053,813 B2 | 6/2015 | Kang et al. | |
| 9,189,330 B2 | 11/2015 | Lastras et al. | |
| 9,367,391 B2 | 6/2016 | Lam | |
| 9,424,953 B2 | 8/2016 | Hirano | |
| 2002/0162076 A1* | 10/2002 | Talagala | G06F 11/1076 714/819 |
| 2007/0089032 A1 | 4/2007 | Alexander et al. | |
| 2012/0317352 A1* | 12/2012 | Kang | G11C 11/40611 711/106 |
| 2013/0191703 A1* | 7/2013 | Meaney | G06F 11/1004 714/770 |
| 2014/0181620 A1* | 6/2014 | Kotzur | G06F 11/1068 714/764 |
| 2014/0310570 A1* | 10/2014 | Lastras | G06F 11/10 714/764 |
| 2015/0200685 A1 | 7/2015 | Kawano et al. | |
| 2015/0347292 A1* | 12/2015 | Fujita | G06F 12/0246 711/103 |
| 2018/0081545 A1* | 3/2018 | Hong | G06F 3/0604 |

\* cited by examiner

BG11: NORMAL SCRUBBING
BG12: WEAK SCRUBBING

BG21: NORMAL SCRUBBING
BG22~BG24: WEAK SCRUBBING

SCRUBBING CONTROLLERS OF SEMICONDUCTOR MEMORY DEVICES, SEMICONDUCTOR MEMORY DEVICES AND METHODS OF OPERATING THE SAME

CROSS-REFERENCE TO RELATED APPLICATION

This U.S. nonprovisional application claims priority under 35 U.S.C. § 119 to Korean Patent Application No. 10-2016-0159158, filed on Nov. 28, 2016, in the Korean Intellectual Property Office, the disclosure of which is incorporated by reference herein in its entirety.

TECHNICAL FIELD

The present inventive concept relates to memories, and more particularly, to scrubbing controllers of semiconductor memory devices, semiconductor memory devices and methods of operating the same.

DISCUSSION OF RELATED ART

Semiconductor memory devices may be classified as non-volatile memory devices that retain stored information after having been powered down and volatile memory devices that lose content when powered down. Flash memory devices are examples of non-volatile memory devices and dynamic random access memories (DRAMs) are examples of volatile memory devices. DRAMs are being used for system memories due to their high speed operation and cost efficiency. However, as DRAMs shrink in size, bit errors of memory cells in the DRAMs may increase and, consequently, yield of the DRAMs may decrease.

SUMMARY

According to an exemplary embodiment of the inventive concept, a scrubbing controller of a semiconductor memory device includes a scrubbing address generator and a weak codeword address generator. The scrubbing address generator generates a scrubbing address for all codewords in a first bank array of a plurality of bank arrays in a first scrubbing mode. The scrubbing address is associated with a normal scrubbing operation and changes in response to an internal scrubbing signal and a scrubbing command. The weak codeword address generator generates a weak codeword address for weak codewords in the first bank array in a second scrubbing mode. The weak codeword address is associated with a weak scrubbing operation and is generated in response to the internal scrubbing signal.

According to an exemplary embodiment of the inventive concept, a semiconductor memory device includes a memory cell array, a control logic circuit, a plurality of error correction code (ECC) engines and a scrubbing controller. The memory cell array includes a plurality of bank arrays. The control logic circuit controls access to the memory cell array in response to a command and an address from an external memory controller. The plurality of ECC engines correspond to the plurality of bank arrays. The scrubbing controller includes a plurality of scrubbing control engines corresponding to the plurality of bank arrays, respectively. The control logic circuit, in response to a scrubbing command provided from the memory controller, controls the ECC engines and the scrubbing control engines such that a normal scrubbing operation is sequentially performed on all codewords in a first bank array of the plurality of bank arrays and a weak scrubbing operation is sequentially performed on weak codewords of a second bank array of the plurality of bank arrays except the first bank array.

According to an exemplary embodiment of the inventive concept, in a method of operating a semiconductor memory device including a plurality of bank arrays, a scrubbing command is received from an external memory controller, a normal scrubbing operation is sequentially performed, by a first ECC engine in the semiconductor memory device, on all codewords in a first bank array of the plurality of bank arrays in response to the scrubbing command and scrubbing addresses, and a weak scrubbing operation is sequentially performed, by at least two other ECC engines in the semiconductor memory device, on weak codewords in at least two other bank arrays of the plurality of bank arrays except the first bank array in response to the scrubbing command and weak codeword addresses.

According to an exemplary embodiment of the inventive concept, a scrubbing controller of a semiconductor memory device includes: a scrubbing address generator configured to generate a scrubbing address for a plurality of codewords in a first bank array of a plurality of bank arrays in a first scrubbing mode; and a weak codeword address generator configured to generate a weak codeword address for a plurality of weak codewords in the first bank array in a second scrubbing mode.

BRIEF DESCRIPTION OF THE DRAWINGS

The above and other features of the inventive concept will become more clearly understood by describing in detail exemplary embodiments thereof with reference to the accompanying drawings.

DETAILED DESCRIPTION OF THE EMBODIMENTS

Exemplary embodiments of the inventive concept will be described more fully hereinafter with reference to the accompanying drawings.

Figure 1:
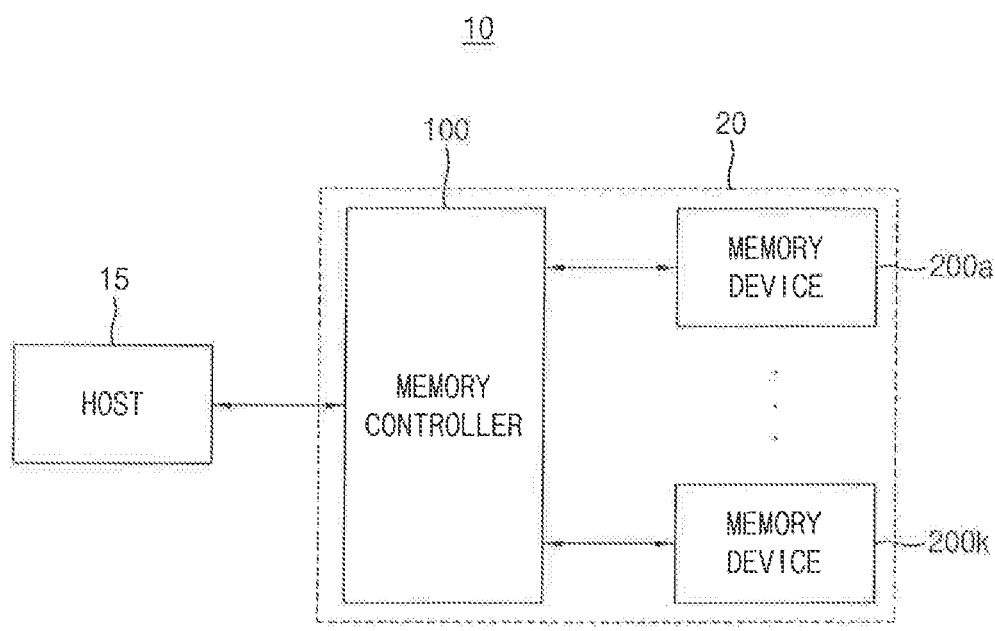
FIG. 1 is a block diagram illustrating an electronic system according to exemplary embodiments of the inventive concept.

FIG. 1 is a block diagram illustrating an electronic system according to exemplary embodiments of the inventive concept.

Referring to FIG. 1, an electronic system (or an electronic device) 10 may include a host 15 (e.g., a host device, a host computer, etc.) and a memory system 20. The memory system 20 may include a memory controller 100 and a plurality of semiconductor memory devices 200a~200k (k is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached small computer system interface (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 15. For example, the request may be a read request including a read command or a write request including a write command and data to write. The read command and the write command may be referred to as access commands.

In addition, the memory controller 100 may issue operation commands to the plurality of semiconductor memory devices 200a~200k for controlling the plurality of semiconductor memory devices 200a~200k.

In exemplary embodiments of the inventive concept, each of the plurality of semiconductor memory devices 200a~200k is a memory device including resistive type memory cells such as a magnetoresistive random access memory (MRAM), a resistive random access memory (RRAM), a phase change random access memory (PRAM) and a ferroelectric random access memory (FRAM), etc. In exemplary embodiments of the inventive concept, each of the plurality of semiconductor memory devices 200a~200k includes dynamic memory cells such as a dynamic random access memory (DRAM).

An MRAM is a nonvolatile computer memory based on magnetoresistance. An MRAM is different from a volatile RAM. For example, since an MRAM is nonvolatile, the MRAM may retain all stored data even when power is turned off.

Although a nonvolatile RAM may be slower than a volatile RAM, an MRAM has read and write response times comparable with read and write response times of a volatile RAM. In addition, an MRAM stores data by using magnetoresistance (or magnetoresistive) elements. For example, a magnetoresistance element is made of two magnetic layers, each having a magnetization.

An MRAM reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM is low cost and has high capacity (like a DRAM), operates at high speed (like a static random access memory (SRAM), and is nonvolatile (like a flash memory).

Figure 2:
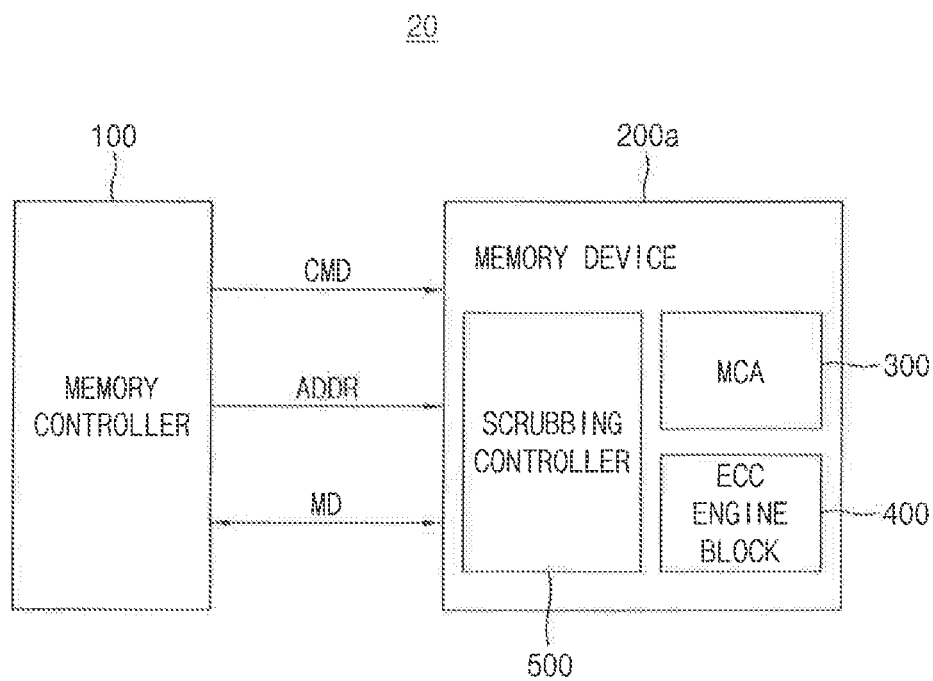
FIG. 2 is a block diagram illustrating a memory system shown in FIG. 1 according to exemplary embodiments of the inventive concept.

FIG. 2 is a block diagram illustrating the memory system shown in FIG. 1 according to exemplary embodiments of the inventive concept.

In FIG. 2, only one semiconductor memory device 200a in communication with the memory controller 100 is illustrated for convenience. However, the details discussed herein related to the one semiconductor memory device 200a may equally apply to the other semiconductor memory devices 200b~200k.

Referring to FIG. 2, the memory system 20 may include the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together in a stack of semiconductor chips).

The memory controller 100 transmits a command CMD and an address ADDR to the semiconductor memory device 200a and exchanges main data MD with the semiconductor memory device 200a.

The semiconductor memory device 200a includes a memory cell array 300 that stores the main data MD, an error correction code (ECC) engine block 400 and a scrubbing controller 500. The ECC engine block 400 and the scrubbing controller 500 perform a scrubbing operation on a first unit of data stored in the memory cell array 300 in response to a scrubbing command from the memory controller 100. The first unit of data may correspond to a codeword of the semiconductor memory device 200a.

Figure 3:
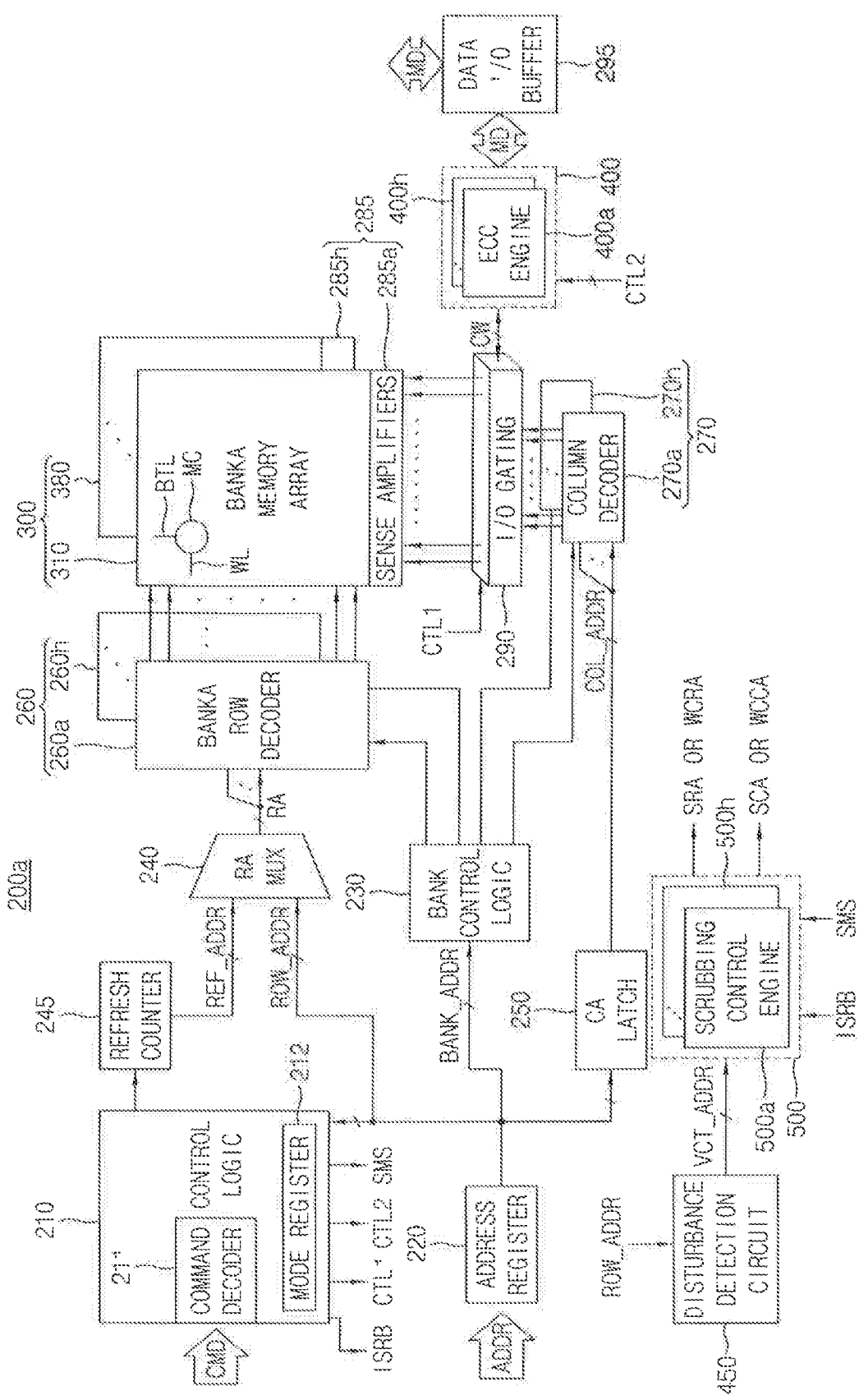
FIG. 3 is a block diagram illustrating a semiconductor memory device in FIG. 2 according to exemplary embodiments of the inventive concept.

FIG. 3 is a block diagram illustrating the semiconductor memory device in FIG. 2 according to exemplary embodiments of the inventive concept.

Referring to FIG. 3, the semiconductor memory device 200a includes a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an input/output (I/O) gating circuit block 290, the ECC engine block 400, a data input/output (I/O) buffer 295, the scrubbing controller 500 and a disturbance detection circuit 450.

The ECC engine block 400 includes first through eighth ECC engines 400a~400h. The scrubbing controller 500 includes first through eighth scrubbing control engines 500a~500h. The I/O gating circuit block 290 includes a plurality of I/O gating circuits corresponding to a plurality of bank arrays.

In exemplary embodiments of the inventive concept, the refresh counter 245 is omitted from the semiconductor memory device 200a. In other words, when the memory cell array 300 is implemented with a plurality of resistive type memory cells, the refresh counter 245 is omitted.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and the first through eighth bank sense amplifiers 285a~285h may form first through eighth banks. Although the semiconductor memory device 200a is illustrated in FIG. 3 as including eight banks, the semiconductor memory device 200a may include any number of banks. For example, there may be more than eight banks or less than eight banks.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h decodes the row address RA that is output from the row address multiplexer 240, and activates a word-line corresponding to the row address RA. For example, the activated bank row decoder applies a word-line driving voltage to the word-line corresponding to the row address RA. The column address latch 250 receives the column address COL_ADDR from the address register 220, and temporarily stores the received column address COL_ADDR. In exemplary embodiments of the inventive concept, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h decodes the column address COL_ADDR that is output from the column address latch 250, and controls the I/O gating circuit block 290 to output data corresponding to the column address COL_ADDR. Each of the I/O gating circuits in the I/O gating circuit block 290 includes a circuitry for gating input/output data, and further includes read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier (one of 285a-285h) coupled to the one bank array from which the data is to be read, and is stored in the read data latches (of the I/O gating circuit block 290). The codeword CW stored in the read data latches may be provided to the memory controller 100 via the data I/O buffer 295 after ECC decoding is performed by a corresponding ECC engine (one of 400a-400h). The main data MD to be written in one bank array of the first through eighth bank arrays 310~380 may be provided to the data I/O buffer 295 from the memory controller and ECC encoding is performed by a corresponding ECC engine.

The data I/O buffer 295 may provide the main data MD from the memory controller 100 to the ECC engine block 400 in a write operation and may provide the main data MD from the ECC engine block 400 to the memory controller 100 in a read operation.

The ECC engine block 400, in a write operation, may generate parity data based on the main data MD from the data I/O buffer 295, and may provide the I/O gating circuit block 290 with the codeword CW including the main data MD and the parity data. The I/O gating circuit block 290 may write the codeword CW in one bank array.

In addition, the ECC engine block 400, in a read operation, may receive the codeword CW, read from one bank array, from the I/O gating circuit block 290. The ECC engine block 400 may perform an ECC decoding on the main data MD based on the parity data in the codeword CW, may correct a single bit error in the main data MD and may provide corrected main data to the data I/O buffer 295.

In addition, the ECC engine block 400 performs a normal scrubbing operation on a codeword read from a memory location designated by a scrubbing address SRA and SCA provided from the scrubbing controller 500 in a first scrubbing mode, or performs a weak scrubbing operation on a codeword read from a memory location designated by a weak codeword address WCRA and WCCA provided from the scrubbing controller 500 in a second scrubbing mode. During the normal scrubbing operation or the weak scrubbing operation, the ECC engine block 400 reads a first unit of data including a main data and a parity data from a memory location, corrects at least one error bit in the first unit of data using the parity data to generate a corrected first unit of data and writes back the corrected first unit of data into the memory location.

The control logic circuit 210 may control operations of the semiconductor memory device 200a. For example, the control logic circuit 210 may generate control signals for the semiconductor memory device 200a to perform a write operation or a read operation. The control logic circuit 210 includes a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290, a second control signal CTL2 to control the ECC engine block 400 and an internal scrubbing signal ISRB and a scrubbing mode signal SMS to control the scrubbing controller 500. The control logic circuit 210 may provide the internal scrubbing signal ISRB and the scrubbing mode signal SMS to the scrubbing controller 500.

When the disturbance detection circuit 450 detects an intensive access to a first memory region of the memory cell array 300, the disturbance detection circuit 450 may provide the scrubbing controller 500 with at least one victim address VCT_ADDR of at least one memory region adjacent to the first memory region such that a scrubbing operation is performed on the at least one memory region adjacent to the first memory region. The adjacent memory region may be referred to as a neighbor or a neighboring memory region.

FIGS. 4A, 4B, 4C, 4D and 4E are circuit diagrams of the memory cell shown in FIG. 3, according to exemplary embodiments of the inventive concept.

Figure 4A:
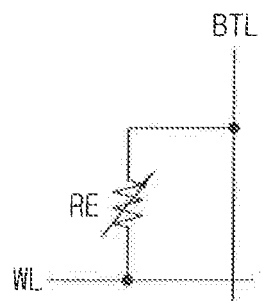
FIGS. 4A, 4B, 4C, 4D and 4E are circuit diagrams of a memory cell shown in FIG. 3, according to exemplary embodiments of the inventive concept.
Figure 4B:
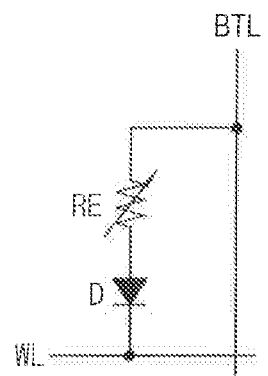
Figure 4C:
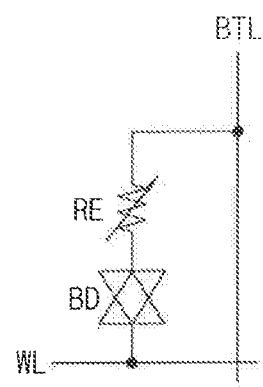
Figure 4D:
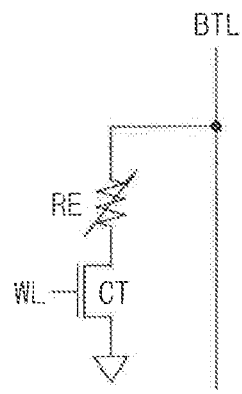
Figure 4E:
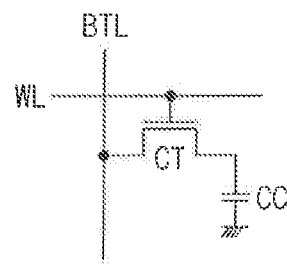

FIGS. 4A to 4D illustrate resistive type memory cells MC and FIG. 4E illustrates a dynamic memory cell MC.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BTL and a word-line WL. Such a resistive memory cell having a structure without a selection element may store data by a voltage applied between the bit-line BTL and the word-line WL.

Referring to FIG. 4B, a memory cell MC may include a resistive element RE and a diode D. The resistive element RE may include a resistive material for data storage. The diode D may be a selection element (or switching element) that supplies current to the resistive element RE or cuts off the current supply to the resistive element RE according to a bias of word-line WL and bit-line BTL. The diode D may be coupled between the resistive element RE and the word-line WL, and the resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element RE may include a resistive material for data storage. The bidirectional diode BD may be coupled between the resistive element RE and a word-line WL, and the resistive element RE may be coupled between a bit-line BTL and bidirectional diode BD. Positions of the bidirectional diode BD and the resistive element RE may be interchangeable. The bidirectional diode BD may block leakage current from flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supplied to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT driven by word-line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage.

Figure 5:
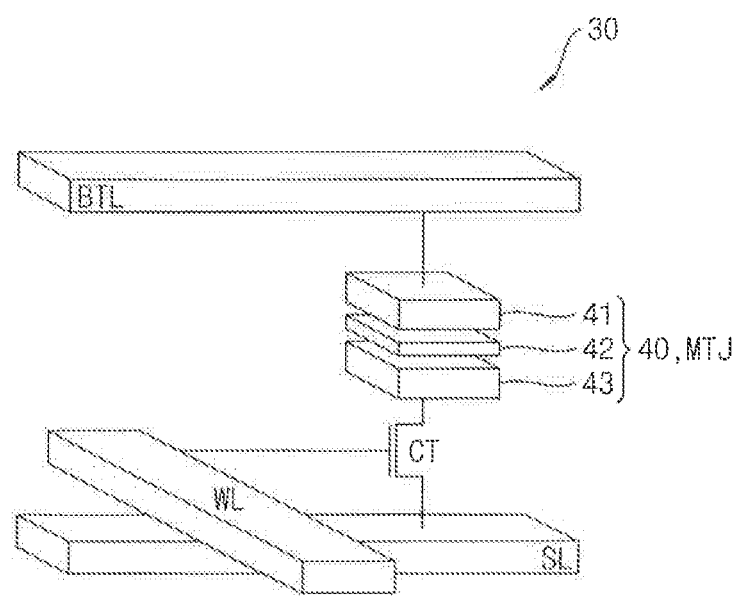
FIG. 5 illustrates the memory cell shown in FIG. 3, according to exemplary embodiments of the inventive concept.

FIG. 5 illustrates the memory cell shown in FIG. 3, according to exemplary embodiments of the inventive concept. The memory cell may be referred to as a spin-transfer torque MRAM (STT-MRAM) cell.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ element 40 to a bit-line BTL. In addition, the other electrode of the cell transistor CT is connected to a source line SL.

The MTJ element 40 may include a free layer 41, a pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. To fix the magnetization direction of the pinned layer 43, an anti-ferromagnetic layer may be further provided, for example.

To perform a write operation of the STT-MRAM cell 30, a logic high voltage is applied to the word-line WL to turn on the cell transistor CT. A program current, for example, a write current, is applied to the bit-line BL and the source line SL. A direction of the write current is determined by a logic state of the MTJ element 40.

To perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, detected by the sense amplifier 285a, and compared with a reference voltage from a reference voltage to determine a logic state of the MTJ element 40. Accordingly, data stored in the MTJ element 40 may be detected.

Figure 6:
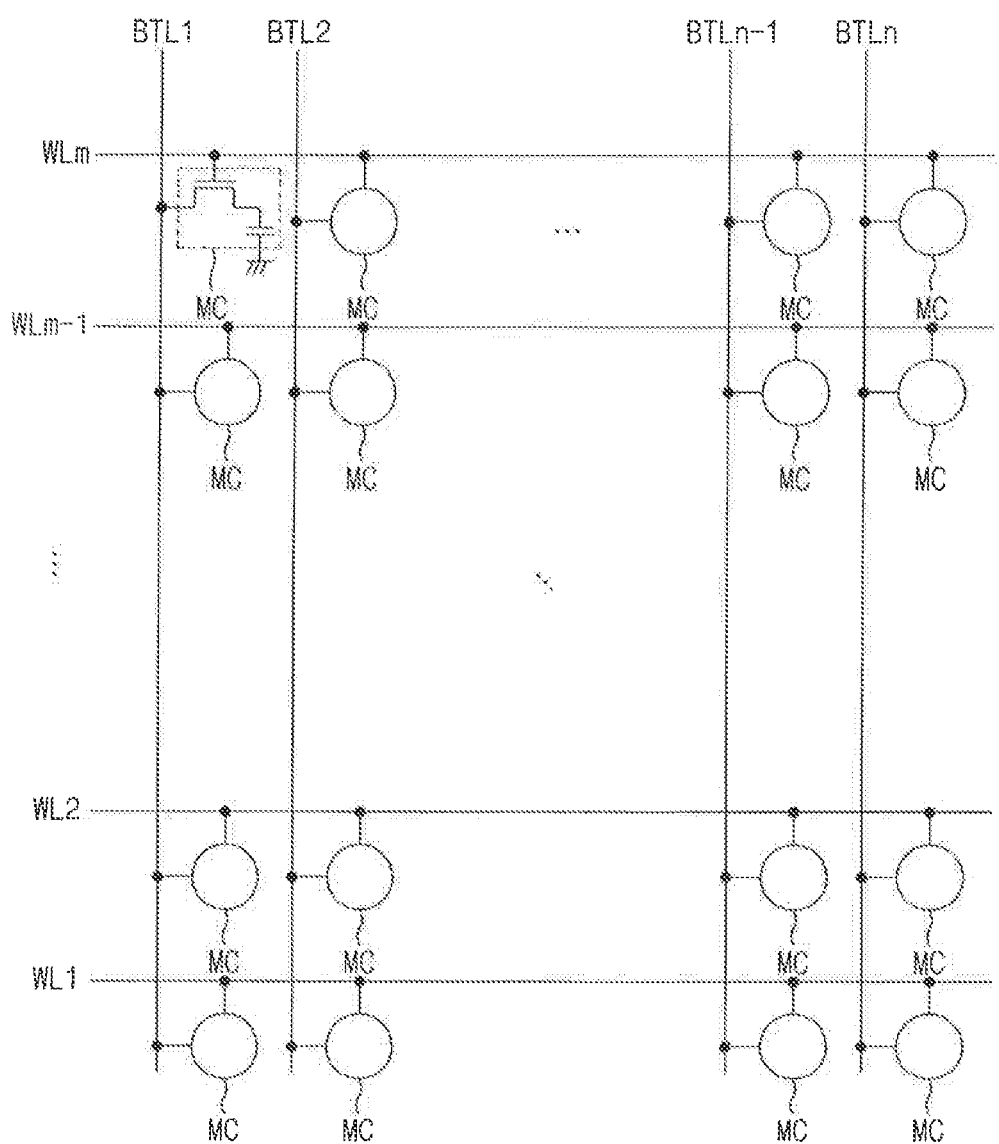
FIG. 6 illustrates a first bank array in the semiconductor memory device of FIG. 3 of the inventive concept.

FIG. 6 illustrates the first bank array in the semiconductor memory device of FIG. 3 according to an exemplary embodiment of the inventive concept.

Referring to FIG. 6, the first bank array 310 includes a plurality of word-lines WL1~WLm (m is a natural number greater than two), a plurality of bit-lines BTL1~BTLn (n is a natural number greater than two), and a plurality of memory cells MCs disposed near intersections between the word-lines WL1~WLm and the bit-lines BTL1~BTLn.

Figure 7:
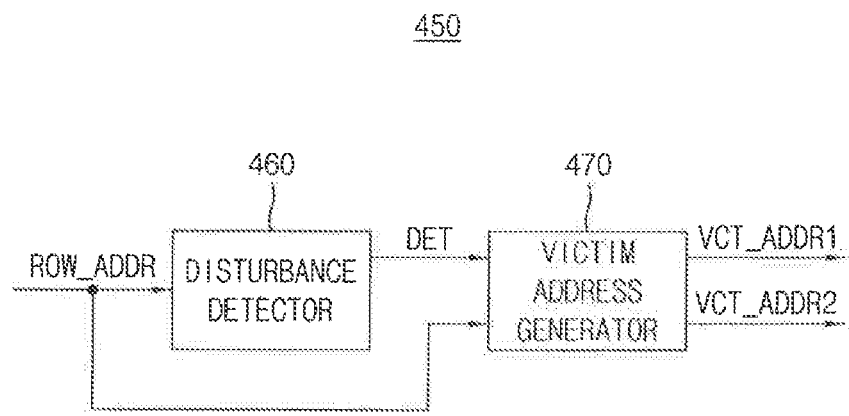
FIG. 7 is a block diagram illustrating a disturbance detection circuit in the semiconductor memory device of FIG. 3 according to exemplary embodiments of the inventive concept.

FIG. 7 is a block diagram illustrating the disturbance detection circuit in the semiconductor memory device of FIG. 3 according to exemplary embodiments of the inventive concept.

Referring to FIG. 7, the disturbance detection circuit 450 includes a disturbance detector 460 and a victim address generator 470.

The disturbance detector 460 may count a number of accesses to the first memory region based on the row address ROW_ADDR and may generate a detection signal DET when the number of the counted accesses reaches a reference value during a reference (or predetermined) time interval. For example, the first memory region may correspond to memory cells connected to a row of a bank of the memory cell array 300, wherein the memory cells correspond to the row address ROW_ADDR input to the disturbance detector 460.

The victim address generator 470 may generate at least one victim address VCT_ADDR1 and VCT_ADDR2 in response to the row address ROW_ADDR and the detection signal DET. The at least one victim address VCT_ADDR1 and VCT_ADDR2 may be a row address designating a second memory region and a third memory region which are located adjacent to the first memory region. The victim address generator 470 may provide the at least one victim address VCT_ADDR1 and VCT_ADDR2 to the scrubbing controller 500. For example, the victim address VCT_ADDR1 may correspond to a row address above the row address ROW_ADDR and the victim address VCT_ADDR2 may correspond to a row address below the row address ROW_ADDR. In other words, the victim address VCT_ADDR1 may correspond to a row above the row of the bank corresponding to the memory cells of the first memory region, and the victim address VCT_ADDR2 may correspond to a row below the row of the bank corresponding to the memory cells of the first memory region.

Figure 8:
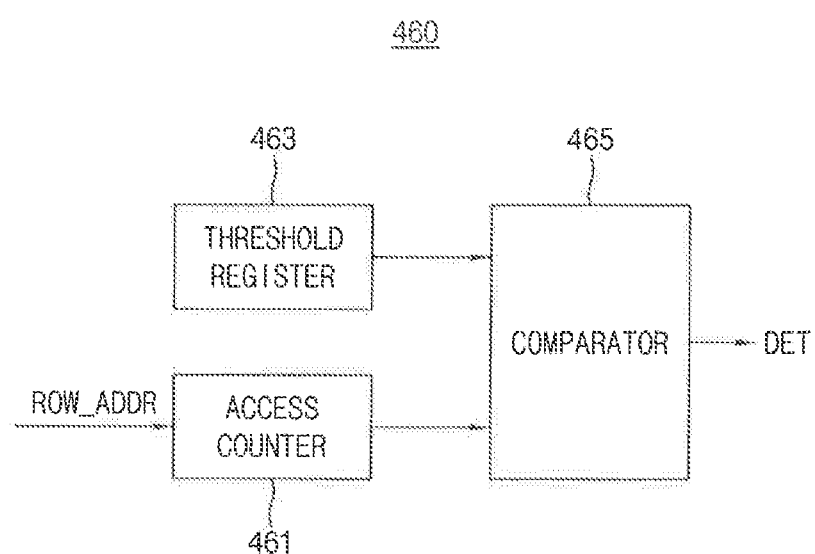
FIG. 8 is a block diagram illustrating a disturbance detector in the disturbance detection circuit of FIG. 7 according to exemplary embodiments of the inventive concept.

FIG. 8 is a block diagram illustrating the disturbance detector in the disturbance detection circuit of FIG. 7 according to exemplary embodiments of the inventive concept.

Referring to FIG. 8, the disturbance detector 460 includes an access counter 461, a threshold register 463 and a comparator 465.

The access counter 461 may count a number of accesses to a specified address (or a specified memory region) based on the row address ROW_ADDR. For example, the access counter 461 may count a number of accesses to a specified word-line. The number of accesses may be counted on a specific word-line or a word-line group including at least two word-lines. In addition, a count of the number of accesses may be performed by a specific block unit, a bank unit, or a chip unit.

The threshold register 463 may store a maximum disturbance occurrence count that guarantees the reliability of data in a specific word-line or a memory unit. For example, a threshold (or a first reference value) on one word-line may be stored in the threshold register 463. Alternatively, a threshold on one word line group, one block, one bank unit, or one chip unit may be stored in the threshold register 463.

The comparator 465 may compare the threshold stored in the threshold register 463 with the number of accesses to a specific memory region counted by the access counter 461. If there is a memory region where the counted number of accesses reaches the first reference value, the comparator 465 generates the detection signal DET.

Figure 9:
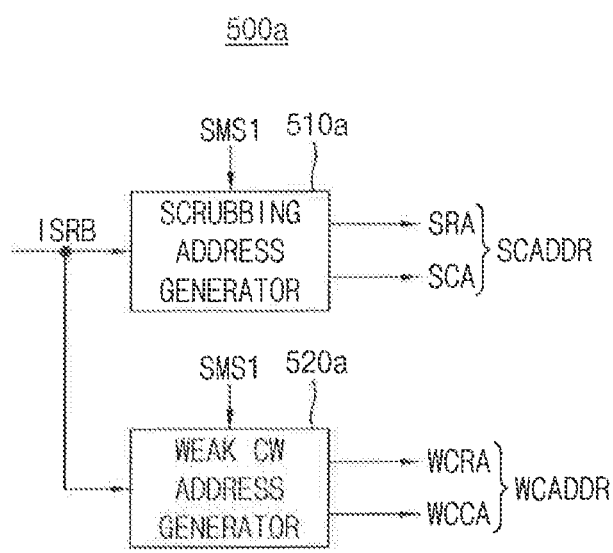
FIG. 9 is a block illustrating a scrubbing control engine in a scrubbing controller in FIG. 3 according to exemplary embodiments of the inventive concept.

FIG. 9 is a block illustrating a scrubbing control engine in the scrubbing controller in FIG. 3 according to exemplary embodiments of the inventive concept.

Referring to FIG. 9, a scrubbing control engine 500a includes a scrubbing address generator 510a and a weak codeword address generator 520a.

The scrubbing address generator 510a generates a scrubbing address SCADDR associated with a normal scrubbing operation for all codewords in the first bank array 310. The scrubbing address SCADDR gradually changes in a first scrubbing mode in response to the internal scrubbing signal ISRB and a scrubbing mode signal SMS1. The internal scrubbing signal ISRB is enabled in synchronization with a reception timing of a scrubbing command applied from the memory controller 100. The scrubbing address SCADDR includes a scrubbing row address SRA and a scrubbing column address SCA. The scrubbing row address SRA designates one page in the first bank array 310 and the scrubbing column address SCA designates one of codewords in the one page. The scrubbing address generator 510a provides the scrubbing row address SRA to the first row decoder 260a and provides the scrubbing column address SCA to the first column decoder 270a.

The weak codeword generator 520a generates a weak codeword address WCADDR associated with a weak scrubbing operation associated with weak codewords in the first bank array 310 in a second scrubbing mode. The weak codeword address WCADDR is generated in response to the internal scrubbing signal ISRB and the scrubbing mode signal SMS1. The weak codeword address WCADDR includes a weak codeword row address WCRA and a weak codeword column address WCCA. The scrubbing mode signal SMS1 indicates the first scrubbing mode when the scrubbing mode signal SMS1 has a first logic level and indicates the second scrubbing mode when the scrubbing mode signal SMS1 has a second logic level. The weak codeword address generator 520a provides the weak codeword row address WCRA to the first row decoder 260a and provides the weak codeword column address WCCA to the first column decoder 270a.

Figure 10:
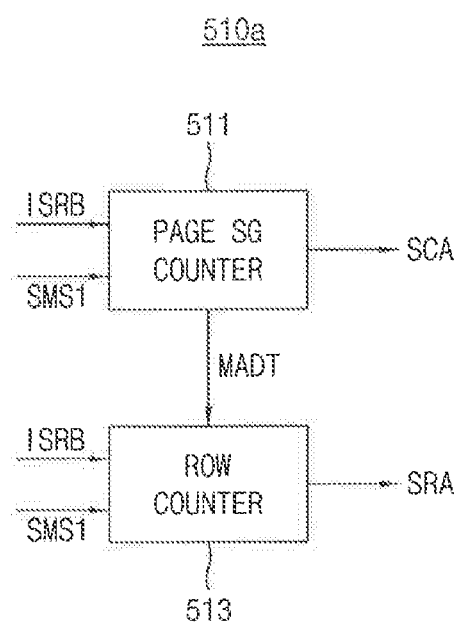
FIG. 10 is a block diagram illustrating a scrubbing address generator in the scrubbing control engine of FIG. 9 according to exemplary embodiments of the inventive concept.

FIG. 10 is a block diagram illustrating the scrubbing address generator in the scrubbing control engine of FIG. 9 according to exemplary embodiments of the inventive concept.

Referring to FIG. 10, the scrubbing address generator 510a includes a page segment counter 511 and a row counter 513.

The page segment counter 511 increases the scrubbing column address SCA by one when the scrubbing command is applied in the first scrubbing mode. The page segment counter 511 actives a maximum address detection signal MADT when the scrubbing column address SCA reaches its maximum value in response to the internal scrubbing signal ISRB and the scrubbing mode signal SMS1, in the first scrubbing mode. The page segment counter 511 provides the maximum address detection signal MADT to the row counter 513. The row counter 513 starts a counting operation when it receives the internal scrubbing signal ISRB and increases the scrubbing row address SRA by one when it receives the activated maximum address detection signal MADT.

Figure 11:
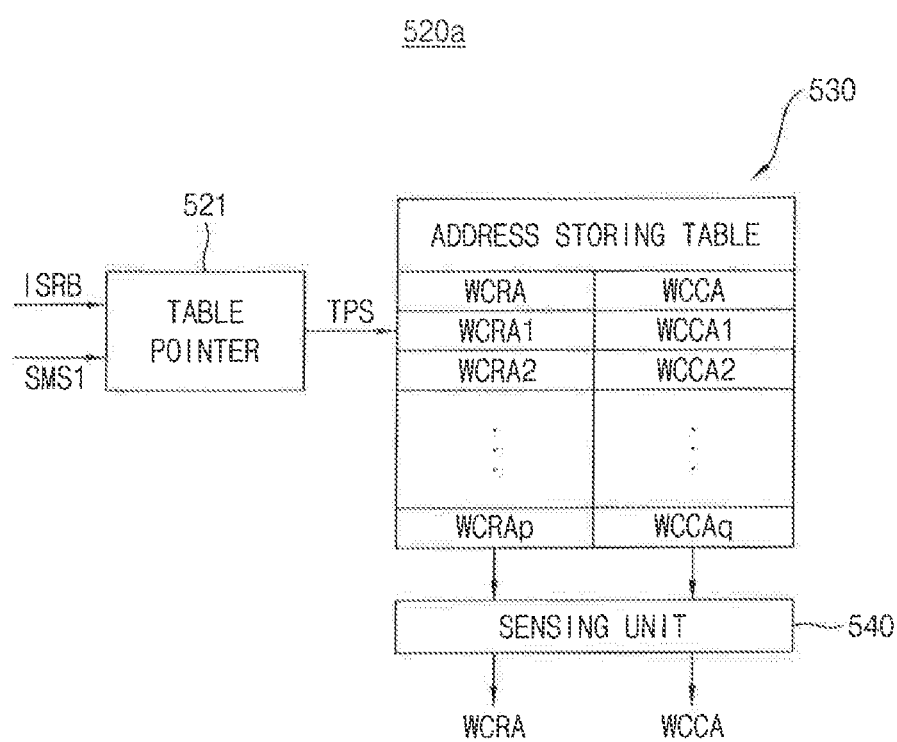
FIG. 11 illustrates a weak codeword address generator in the scrubbing control engine of FIG. 9 according to exemplary embodiments of the inventive concept.

FIG. 11 illustrates the weak codeword address generator in the scrubbing control engine of FIG. 9 according to exemplary embodiments of the inventive concept.

Referring to FIG. 11, the weak codeword address generator 520a includes a table pointer 521, an address storing table 530 and a sensing unit 540.

The address storing table 530 stores address information WCRA1~WCRAp and WCCA1~WCCAq (q is a positive integer greater than p) of weak codewords in a corresponding bank array. The weak codewords may be all or some of a weak page including a number of error bits greater than a reference value among pages in the first bank array 310. In addition, the weak codewords may be codewords of neighbor pages adjacent to the intensively accessed memory region.

The table pointer 521 generates a pointer signal TPS and provides the pointer signal TPS to the address storing table 530. The pointer signal TPS provides location information for the address storing table 530. The pointer signal TPS is generated in response to the internal scrubbing signal ISRB and the scrubbing mode signal SMS when the table pointer 521 receives the internal scrubbing signal ISRB in the second scrubbing mode. The address storing table 530 may include a nonvolatile storage. The at least one victim address VCT_ADDR1 and VCT_ADDR2 provided from the victim address generator 470 in FIG. 7 may be stored in the address storing table 530.

The pointer signal TPS gradually increases when the internal scrubbing signal ISRB is applied. The address storing table 530 may output the weak codeword address stored in a location (indicated by the pointer signal TPS) as the weak codeword row address WCRA and the weak codeword column address WCCA through the sensing unit 540 in response to the pointer signal TPS when the pointer signal TPS is applied. The sensing unit 540 provides the weak codeword row address WCRA to a corresponding row decoder of the bank row decoder 260 and provides the weak codeword column address WCCA to a corresponding column decoder of the column decoder 270.

Figure 12:
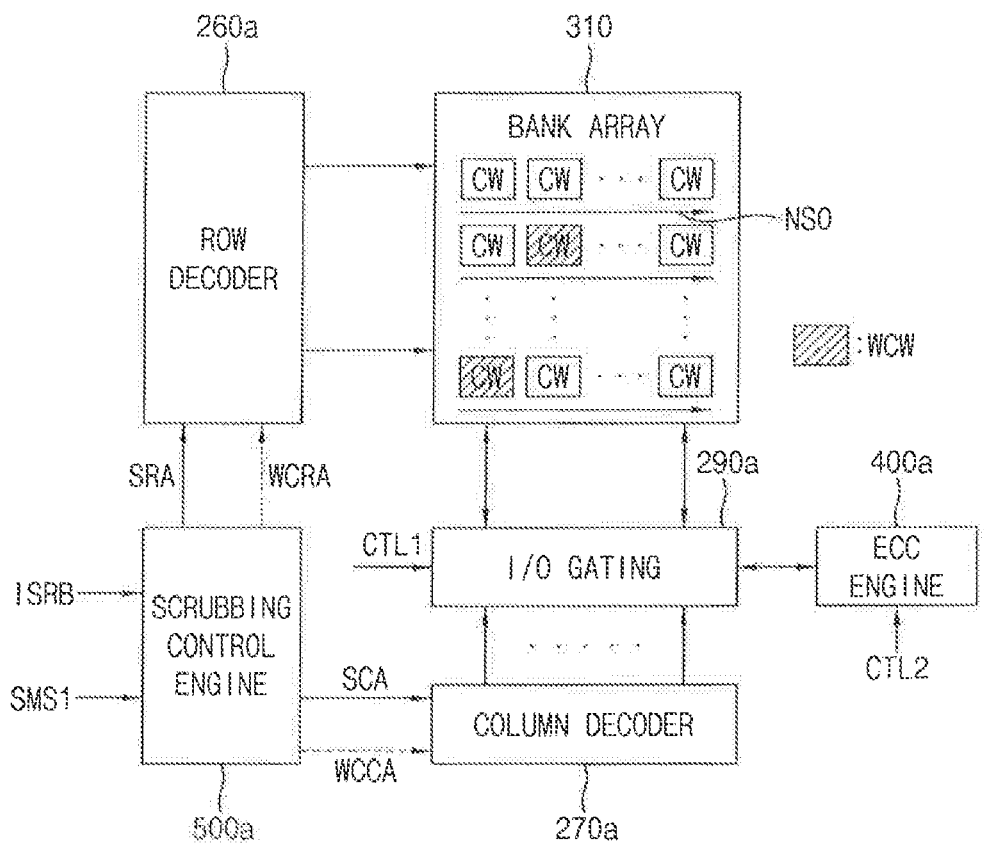
FIG. 12 illustrates the semiconductor memory device of FIG. 3 in a first scrubbing mode or a second scrubbing mode according to exemplary embodiments of the inventive concept.

FIG. 12 illustrates the semiconductor memory device of FIG. 3 in a first scrubbing mode or a second scrubbing mode according to an exemplary embodiment of the inventive concept.

In FIG. 12, the first bank array 310 and the row decoder 260a, the column decoder 270a and the I/O gating circuit 290a, the ECC engine 400a and the scrubbing control engine 500a which are associated with the first bank array 310 are illustrated.

In the first scrubbing mode, the scrubbing control engine 500a provides the scrubbing row address SRA to the row decoder 260a and provides the scrubbing column address SCA to the column decoder 270a. The first scrubbing mode designates a normal scrubbing operation on the first bank array 310 by the command CMD and the address ADDR from the memory controller 100, the scrubbing row address SRA and the scrubbing column address SCA designate a codeword to be scrubbed in response to the internal scrubbing signal ISRB and the scrubbing mode signal SMS1 when the scrubbing command CMD is applied. The I/O gating circuit 290a and the ECC engine 400a perform a scrubbing operation such that the I/O gating circuit 290a reads a codeword accessed by the scrubbing row address SRA and the scrubbing column address SCA and provides the read codeword to the ECC engine 400a. The ECC engine 400a corrects one error bit in the main data using the parity data in the main data and provides the corrected codeword to the I/O gating circuit 290a. The I/O gating circuit 290a rewrites the corrected codeword in a memory location from which the codeword is read. In the first scrubbing mode, a normal scrubbing operation NSO is sequentially performed on all codewords CW in the first bank array 310 when the scrubbing command CMD is applied.

In the second scrubbing mode, the command CMD and the address ADDR from the memory controller 100 designate a normal scrubbing operation to be performed on another bank array than the first bank array 310. In the second scrubbing mode, the scrubbing control engine 500a provides the weak codeword row address WCRA to the row decoder 260a and provides the weak codeword column address WCCA to the column decoder 270a in response to the internal scrubbing signal ISRB and the scrubbing mode signal SMS1 when the scrubbing command CMD is applied. The I/O gating circuit 290a and the ECC engine 400a perform the scrubbing operation on a weak codeword WCW accessed by the weak codeword row address WCRA and the weak codeword column address WCCA. The scrubbing operation on the weak codeword WCW may be referred to as a weak scrubbing operation. The weak scrubbing operation is performed on weak codewords stored in the address storing table 530.

Therefore, the semiconductor memory device 200a sequentially performs a normal scrubbing operation on codewords in one bank array while performing a weak scrubbing operation on weak codewords in at least one other bank array in response to the scrubbing command. Accordingly, the semiconductor memory device 200a may increase data reliability and increase performance.

Figure 13:
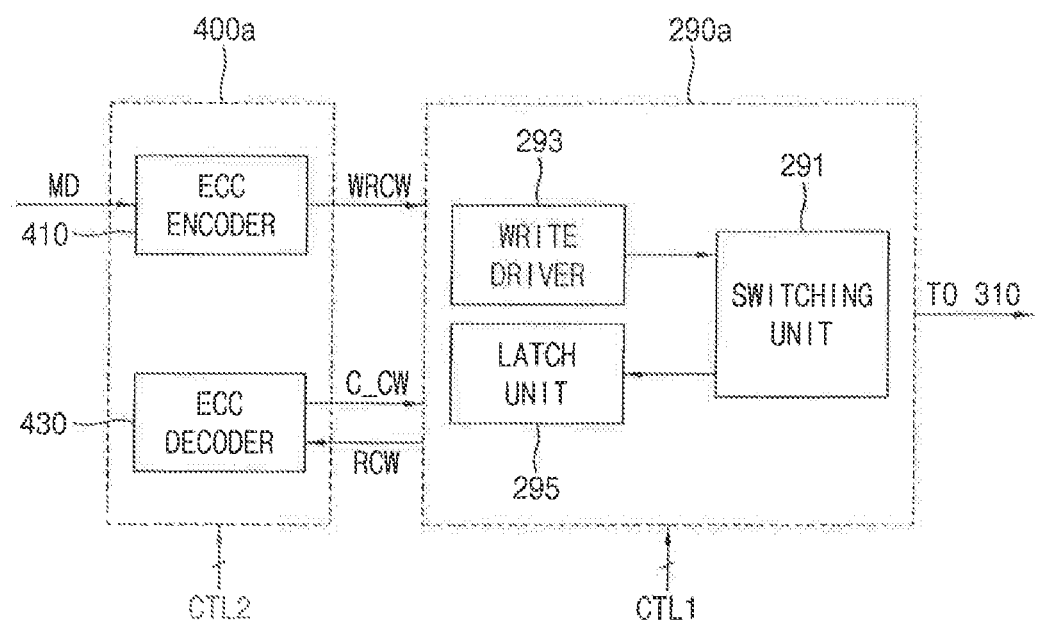
FIG. 13 illustrates an error correction code (ECC) engine and an input/output (I/O) gating circuit connected to a bank array in the semiconductor memory device of FIG. 3 according to exemplary embodiments of the inventive concept.

FIG. 13 illustrates the ECC engine and the I/O gating circuit connected to one bank array in the semiconductor memory device of FIG. 3 according to an exemplary embodiment of the inventive concept.

Referring to FIG. 13, the ECC engine 400a includes an ECC encoder 410 and an ECC decoder 430. The I/O gating circuit 290a includes a switching unit 291, a write driver 293 and a latch unit 295. The switching unit 291 may include a plurality of switches connected to the first bank array 310. The I/O gating circuit 290a may provide the ECC decoder 430 with the read codeword RCW read from a sub-page of a page in the memory cell array 300 in the scrubbing mode. The ECC decoder 430 may correct an error bit in the read codeword RCW using a parity data in the read codeword RCW and may provide a corrected codeword C_CW to the I/O gating circuit 290a. The I/O gating circuit 290a receives the corrected codeword C_CW from the ECC decoder 430 and writes back the corrected data of a sub codeword in a memory location corresponding to the sub codeword in the sub-page. The ECC encoder 410 performs an ECC encoding on the main data MD in a write operation to provide a write codeword WRCW to the I/O gating circuit 290a. The ECC engine 400a may perform the above-described operation in response to the second control signal CTL2.

Figure 14:
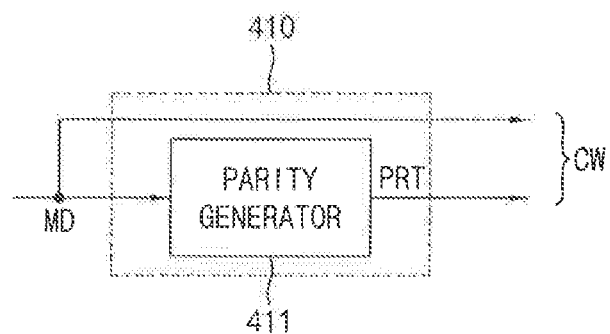
FIG. 14 illustrates an ECC encoder in the ECC engine in FIG. 13 according to exemplary embodiments of the inventive concept.

FIG. 14 illustrates the ECC encoder in the ECC engine in FIG. 13 according to exemplary embodiments of the inventive concept.

Referring to FIG. 14, the ECC encoder 410 includes a parity generator 411. The parity generator 411 performs an ECC encoding on the main data MD to generate the parity data PRT in a write operation and provides the I/O gating circuit 290a with the codeword CW including the main data MD and the parity data PRT.

Figure 15:
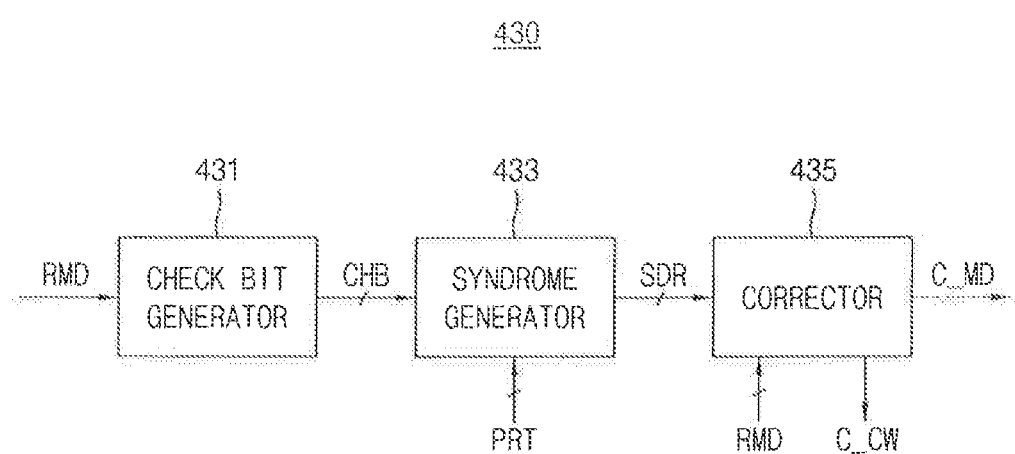
FIG. 15 illustrates the ECC decoder in the ECC engine in FIG. 13 according to exemplary embodiments of the inventive concept.

FIG. 15 illustrates the ECC decoder in the ECC engine in FIG. 13 according to exemplary embodiments of the inventive concept.

Referring to FIG. 15, the ECC decoder 430 includes a check bit generator 431, a syndrome generator 433 and a data corrector 435.

The check bit generator 431 generates check bits CHB based on a read data RMD. The syndrome generator 433 generates a syndrome data SDR based on a comparison of the check bits CHB to the parity data PRT included in the read codeword. The syndrome data SDR may indicate whether the read data RMD includes at least one error bit and may also indicate a position of the error bit. The data corrector 435 may correct the error bit in the read data RMD based on the syndrome data SDR, may provide the corrected codeword C_CW to the I/O gating circuit 290a in a scrubbing mode and may provide the corrected main data C_MD to the data I/O buffer 295 in a read operation.

Figure 16:
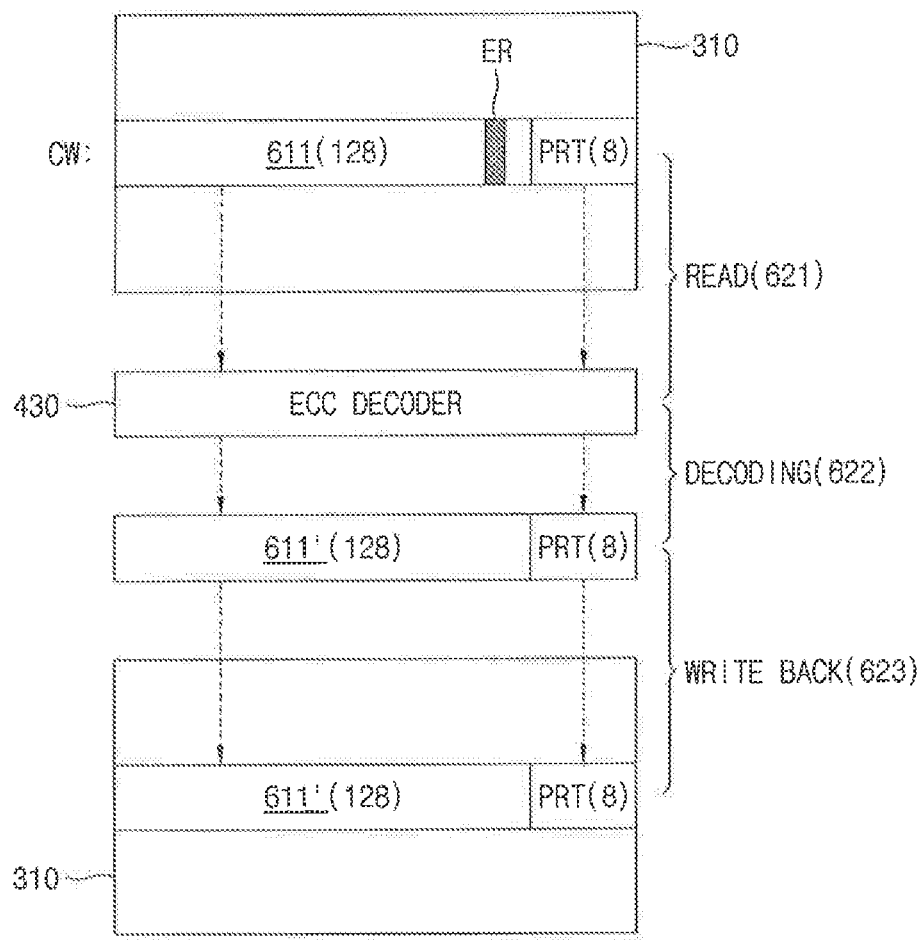
FIGS. 16 and 17 illustrate a scrubbing operation performed on a codeword in the semiconductor memory device of FIG. 12 according to an exemplary embodiment of the inventive concept.
Figure 17:
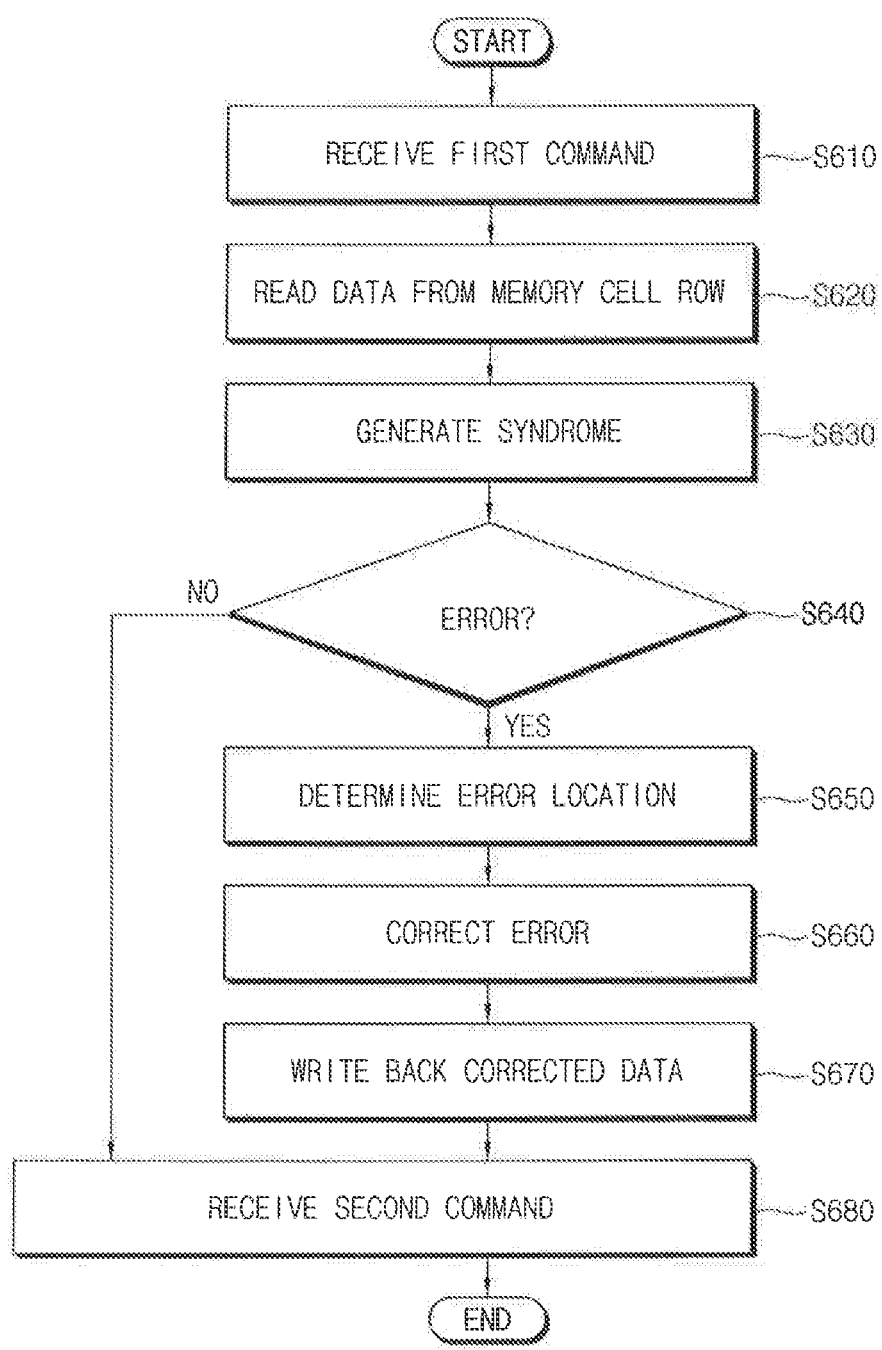

FIGS. 16 and 17 illustrate a scrubbing operation is performed on a codeword in the semiconductor memory device of FIG. 12 according to an exemplary embodiment of the inventive concept.

Referring to FIGS. 3, 12, 16 and 17, the control logic circuit 210 receives a first command CMD and an address ADDR from the memory controller 100 (S610). The first command CMD designates a normal scrubbing operation on the first bank array 310.

The I/O gating circuit 290a reads a codeword CW including a 128-bit main data 611 and 8-bit parity data PRT from a memory location in the first bank array 310 and provides the codeword CW to the ECC decoder 430 as indicated by reference numeral 621 (S620). The ECC decoder 430 generates the syndrome data (S630) to determine whether the codeword CW includes an error bit (S640).

When the codeword CW includes an error bit ER (YES in S640), the ECC decoder 430 determines a location of at least one error bit based on the syndrome data (S650), corrects the error bit ER in the main data 611 based on the parity data PRT in the codeword as indicated by reference numeral 622 (S660), and provides the corrected main data 611' and the parity data PRT to the I/O gating circuit 290a. The I/O gating circuit 290a writes back the main data 611' and the parity data PRT in the memory location in a memory location as indicated by reference numeral 623 (S670).

After writing back the corrected data, the control logic circuit 210 receives a second command CMD from the memory controller (S680). When the codeword CW does not includes an error bit ER (NO in S640), the control logic circuit 210 receives a second command CMD from the memory controller (S680).

The scrubbing operation in FIG. 16 may correspond to a normal scrubbing operation on one codeword or a weak scrubbing operation on a weak codeword.

Figure 18:
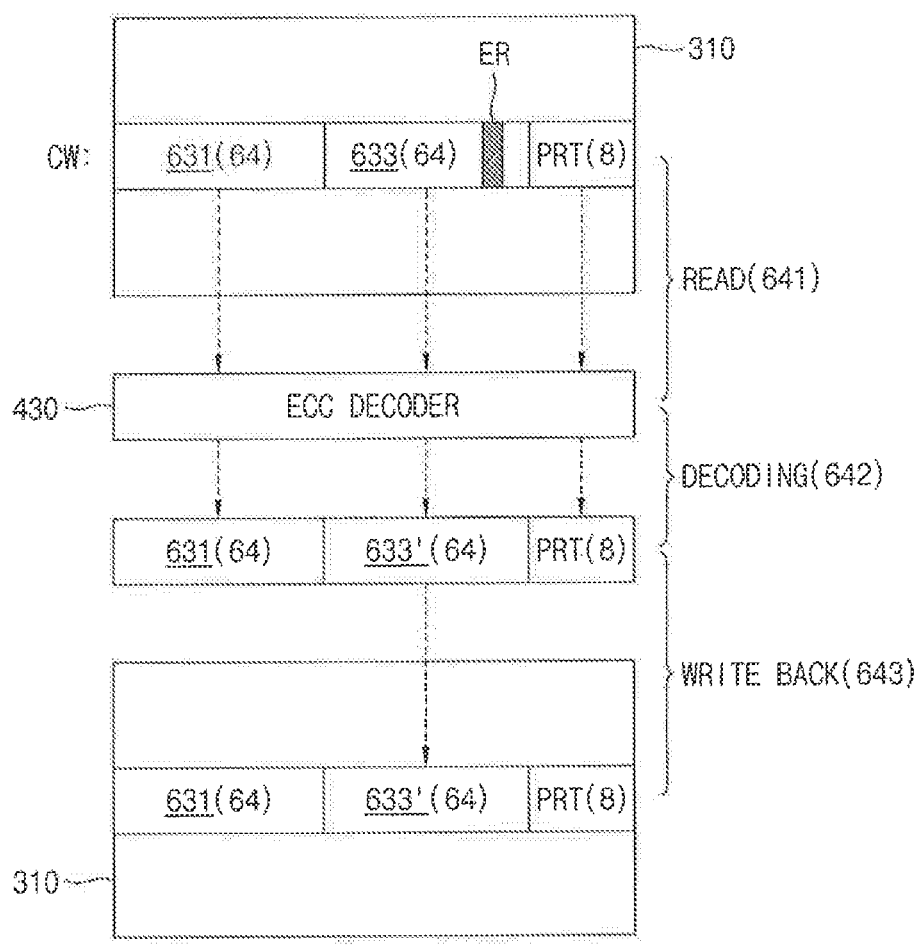
FIGS. 18 and 19 illustrate a scrubbing operation performed on a codeword in the semiconductor memory device of FIG. 12 according to an exemplary embodiment of the inventive concept.
Figure 19:
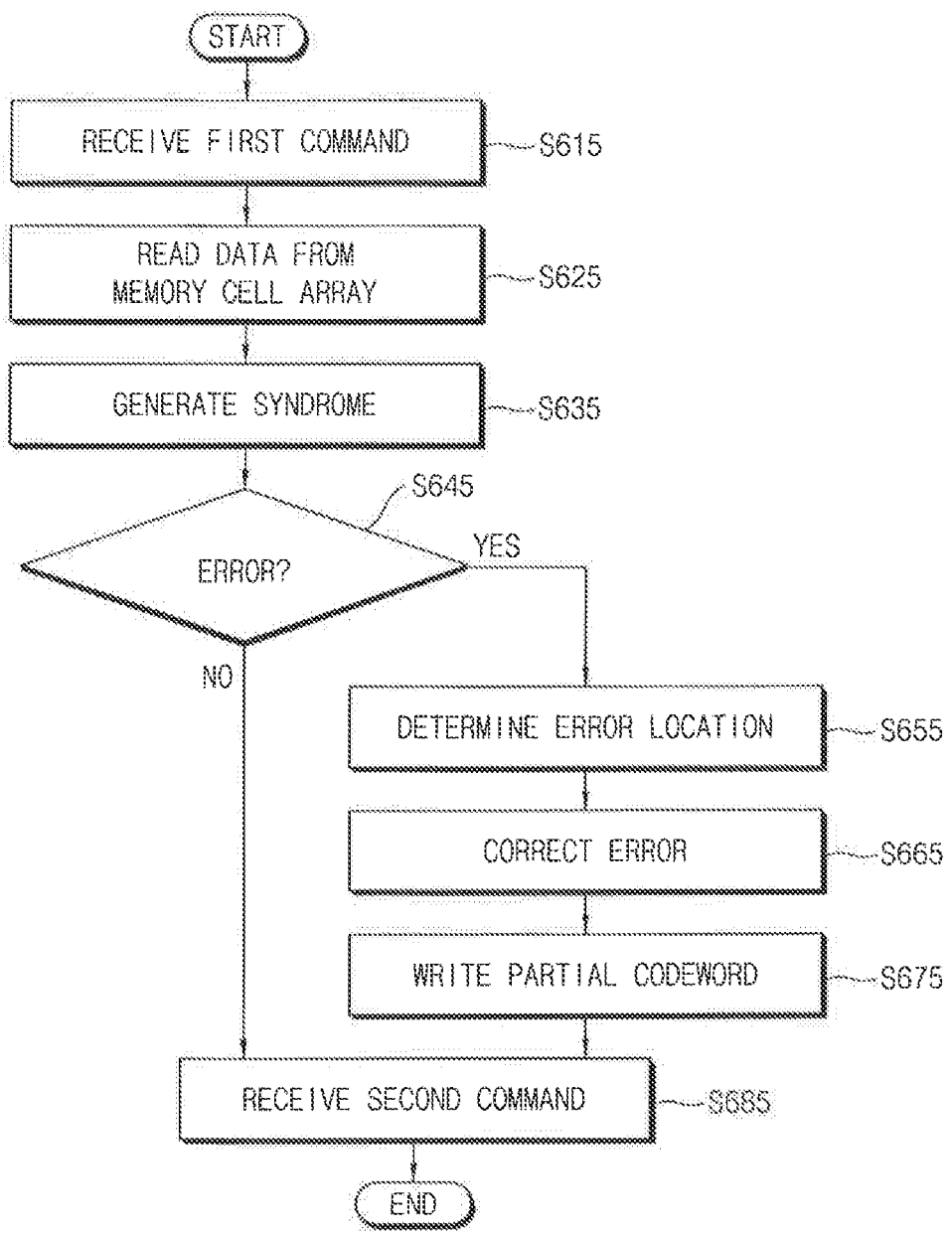

FIGS. 18 and 19 illustrate a scrubbing operation performed on a codeword in the semiconductor memory device of FIG. 12 according to an exemplary embodiment of the inventive concept.

Referring to FIGS. 3, 12, 18 and 19, the control logic circuit 210 receives a first command CMD and an address ADDR from the memory controller 100 (S615). The first command CMD designates a normal scrubbing operation on the first bank array 310.

The I/O gating circuit 290a reads a codeword CW including a 64-bit first sub unit of data 631, a 64-bit second sub unit of data 633 and a 8-bit parity data PRT from a sub-page of a page in the first bank array 310 and provides the codeword CW to the ECC decoder 430 as indicated by reference numeral 641. In other words, data is read from the memory cell array (S625). The ECC decoder 430 generates the syndrome data (S635) by performing an ECC decoding one the main data 631 and 633 to determine whether the codeword CW includes an error bit (S645). The second sub unit of data 633 may include an error bit ER.

When the codeword CW includes the error bit ER (YES in 645), the ECC decoder 430 performs an ECC decoding on the codeword CW to determine a position of the error bit ER as indicated by reference numeral 642 (S655), corrects the error bit ER in the second sub unit of data 633 (S665) and provides the corrected second sub unit of data 633' to the I/O gating circuit 290a. The I/O gating circuit 290a may write back the corrected second sub unit of data 633' in a memory location corresponding to the second sub unit 633 of the sub-page as indicated by reference numeral 643 (S675). However, the I/O gating circuit 290a may mask (block) the writing of the first sub unit 631 back to a memory location corresponding to the first sub unit of data 631.

The control logic circuit 210 receives a second command CMD from the memory controller (S685). When the codeword CW does not includes an error bit ER (NO in S645), the control logic circuit 210 receives a second command CMD from the memory controller (S685).

The scrubbing operation in FIG. 18 may reduce power consumption during a scrubbing operation by only writing back a sub unit of data including an error bit to a memory location.

The scrubbing operation in FIG. 18 may correspond to a normal scrubbing operation on one codeword or a weak scrubbing operation on a weak codeword.

Figure 20:
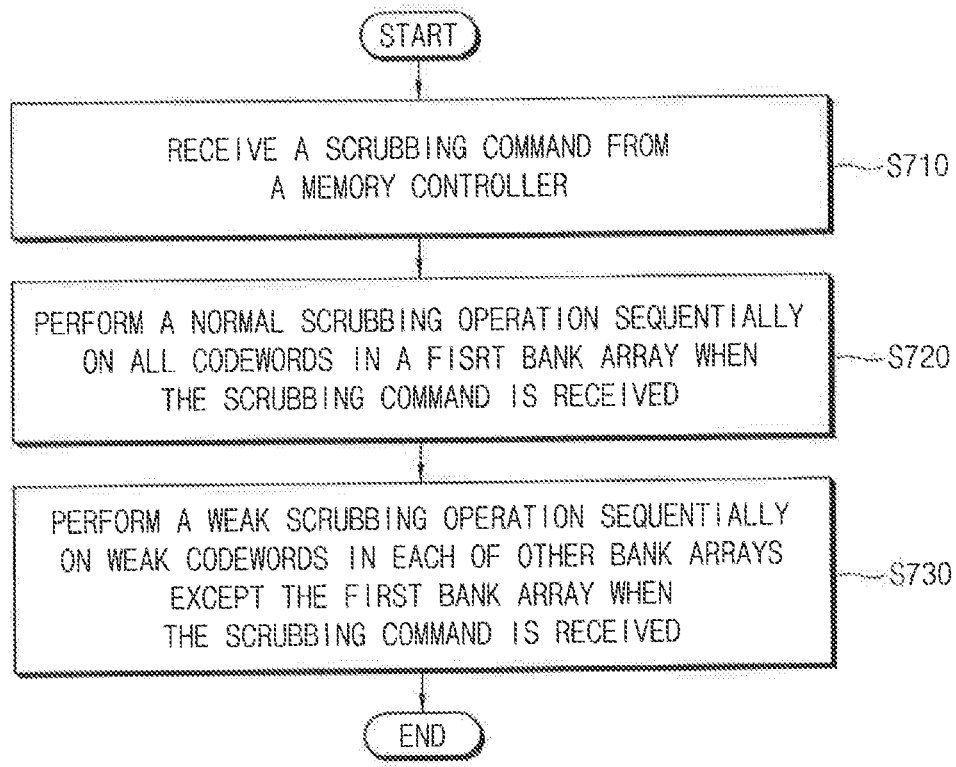
FIG. 20 is a flow chart illustrating a method of operating a semiconductor memory device including a plurality of bank arrays according to exemplary embodiments of the inventive concept.

FIG. 20 is a flow chart illustrating a method of operating a semiconductor memory device including a plurality of bank arrays according to exemplary embodiments of the inventive concept.

Referring to FIGS. 2 through 20, in a method of operating the semiconductor memory device 200a including the plurality of bank arrays 310~380, the semiconductor memory device 200a receives a scrubbing command CMD from the memory controller 100 periodically or non-periodically (S710).

When the memory device 200a receives the scrubbing command CMD, the scrubbing control engine 500a corresponding to the first bank array 310 sequentially generates scrubbing addresses SCADDR in response to the internal scrubbing signal ISRB and the scrubbing mode signal SMS1. The I/O gating circuit 290a and the ECC engine 400a perform a normal scrubbing operation to read a codeword CW from a memory location designated by the scrubbing address ADDR, perform an ECC decoding on the codeword CW, correct an error bit when the codeword CW includes an error bit and write back the error-corrected codeword in the memory location (S720).

In the first bank array 310, the scrubbing control engine 500a sequentially increases the scrubbing addresses SCADDR when the scrubbing command CMD is received to sequentially perform the normal scrubbing operation on all codewords in the first bank array 310 such that each codeword in the first bank array 310 is scrubbed one time during a scrubbing period.

While the normal scrubbing operation is sequentially performed on the codewords in the first bank array 310, in at least one of the second through eighth bank arrays 320~380, a corresponding scrubbing control engine sequentially generates weak codeword addresses WCADDR in response to the internal scrubbing signal ISRB and the scrubbing mode signal SMS1. A corresponding I/O gating circuit and a corresponding ECC engine perform a weak scrubbing operation to read a codeword CW from a memory location designated by weak codeword addresses WCADDR, perform an ECC decoding on the codeword CW, correct an error bit when the codeword CW includes an error bit and write back the error-corrected codeword in the memory location (S730).

Therefore, the semiconductor memory device 200a sequentially performs the normal scrubbing operation on codewords in one bank array while performing a weak scrubbing operation on weak codewords in at least one of other bank arrays in response to the scrubbing command. Accordingly, the semiconductor memory device 200a may increase data reliability and increase performance.

Figure 21:
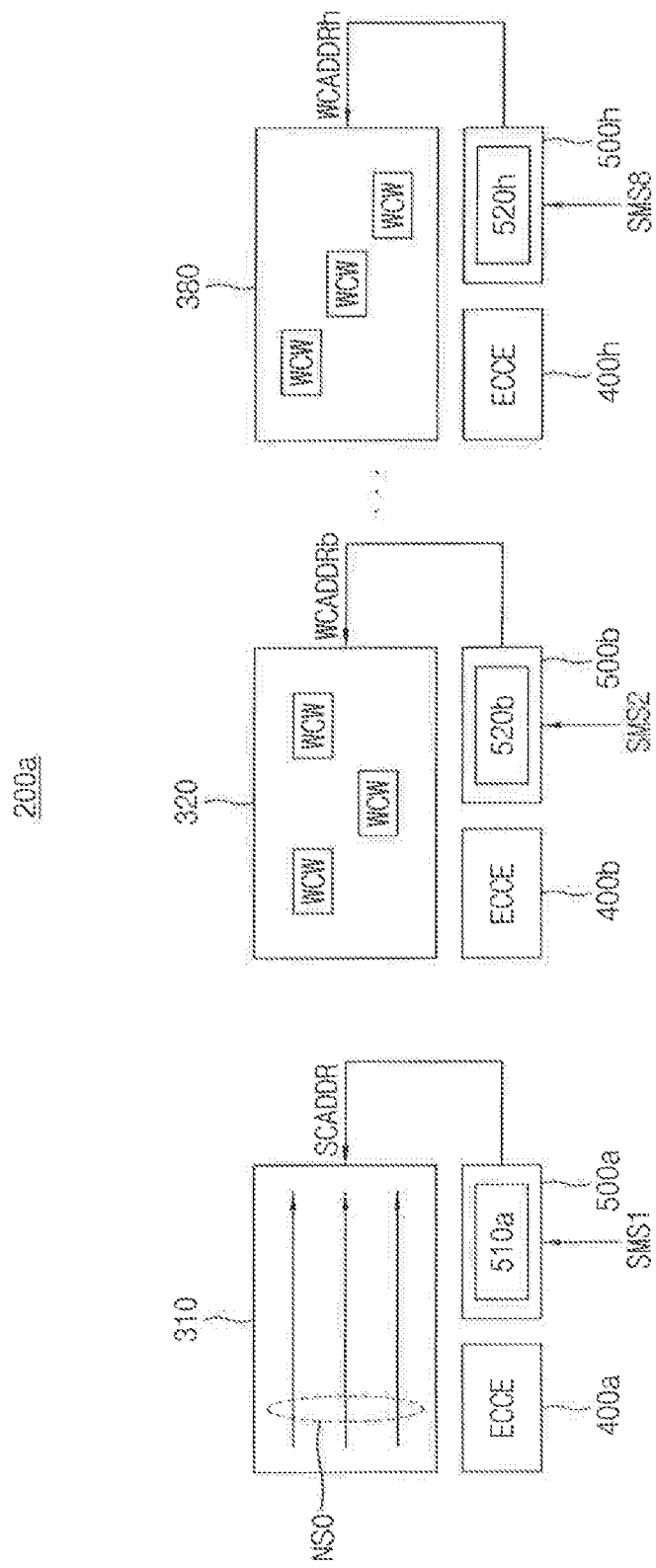
FIG. 21 illustrates a normal scrubbing operation and a weak scrubbing operation performed in the semiconductor memory device of FIG. 3 according to exemplary embodiments of the inventive concept.

FIG. 21 illustrates a normal scrubbing operation and a weak scrubbing operation performed in the semiconductor memory device of FIG. 3 according to exemplary embodiments of the inventive concept.

Referring to FIG. 21, a scrubbing address generator 510a is activated in response to the scrubbing mode signal SMS1 in the scrubbing control engine 500a corresponding to the first bank array 310, and generates the scrubbing address SCADDR. The ECC engine 400a corresponding to the first bank array 310 sequentially performs the normal scrubbing operation NSO on all codewords in the first bank array 310.

A weak codeword address generator 520b is activated in response to a scrubbing mode signal SMS2 in the scrubbing control engine 500b corresponding to the second bank array 320, and generates the weak codeword address WCADDRb. The ECC engine 400b corresponding to the second bank array 320 sequentially performs the weak scrubbing operation on weak codewords in the second bank array 320. In addition, a weak codeword address generator 520h is activated in response to the scrubbing mode signal SMS8 in the scrubbing control engine 500h corresponding to the eighth bank array 380, and generates the weak codeword address WCADDRh. The ECC engine 400h corresponding to the eighth bank array 380 sequentially performs the weak scrubbing operation on weak codewords in the eighth bank array 380.

Figure 22:
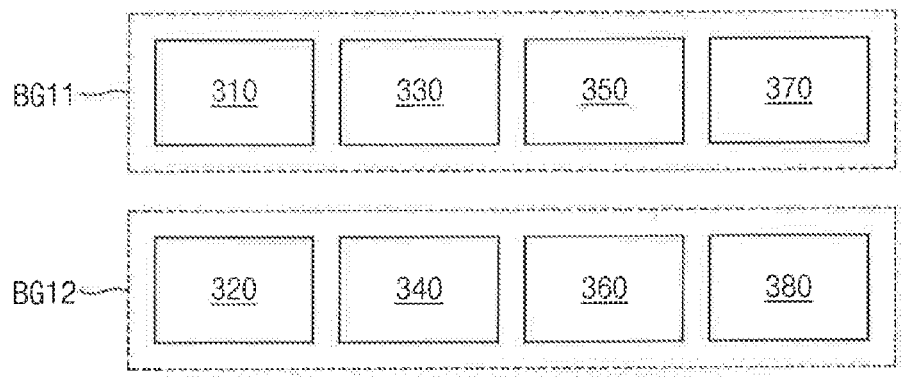
FIG. 22 illustrates bank arrays in the semiconductor memory device of FIG. 3 grouped according to exemplary embodiments of the inventive concept.

FIG. 22 illustrates the bank arrays in the semiconductor memory device of FIG. 3 grouped according to exemplary embodiments of the inventive concept.

Referring to FIGS. 3 and 22, the first through eighth bank arrays 310~380 are grouped into a first bank group BG11 and a second bank group BG12.

The first bank group BG11 includes the first, third, fifth and seventh bank arrays 310, 330, 350 and 370 and the second bank group BG12 includes the second, fourth, sixth and eighth bank groups 320, 340, 360 and 380.

One or more banks (or arrays) may be referred to as a bank group, and one or more banks may share data input/output lines. A plurality of bank arrays included in a single bank group may share a global input/output line for inputting and outputting data. As shown in FIG. 22, while the normal scrubbing operation is performed on each of the first, third, fifth and seventh bank arrays 310, 330, 350 and 370 in the first bank group BG11, the weak scrubbing operation is performed in each of the second, fourth, sixth and eighth bank groups 320, 340, 360 and 380 in the second bank group BG12. However, the inventive concept is not limited thereto. For example, the weak scrubbing operation could be performed on the bank groups of the first bank group BG11 while the normal scrubbing operation is performed on the bank groups of the second bank group BG12.

Figure 23:
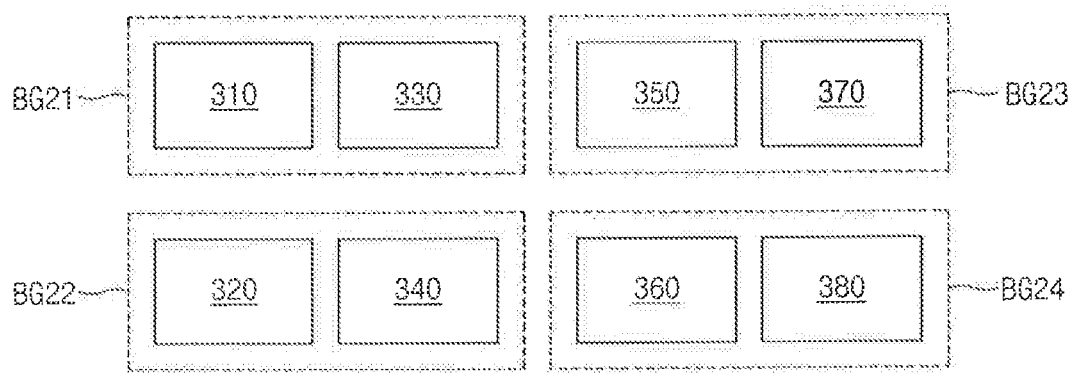
FIG. 23 illustrates the bank arrays in the semiconductor memory device of FIG. 3 grouped according to exemplary embodiments of the inventive concept.

FIG. 23 illustrates the bank arrays in the semiconductor memory device of FIG. 3 grouped according to exemplary embodiments of the inventive concept.

Referring to FIGS. 3 and 23, the first through eighth bank arrays 310~380 may be grouped into first through fourth bank groups BG21~BG24.

The first bank group BG21 includes the first and third bank arrays 310 and 330, the second bank group BG22 includes the second and fourth bank arrays 320 and 340, the third bank group BG23 includes the fifth and seventh bank arrays 350 and 370, and the fourth bank group BG24 includes the sixth and eighth bank arrays 360 and 380. As shown in FIG. 23, while the normal scrubbing operation is performed on the first bank group BG21, the weak scrubbing operation is performed in each of the second through fourth bank groups BG22, BG23 and BG24.

However, the inventive concept is not limited thereto. For example, the weak scrubbing operation could be performed in each of the first, third and fourth bank groups BG21, BG23 and BG24, while the normal scrubbing operation is performed on the second bank group BG22.

Figure 24:
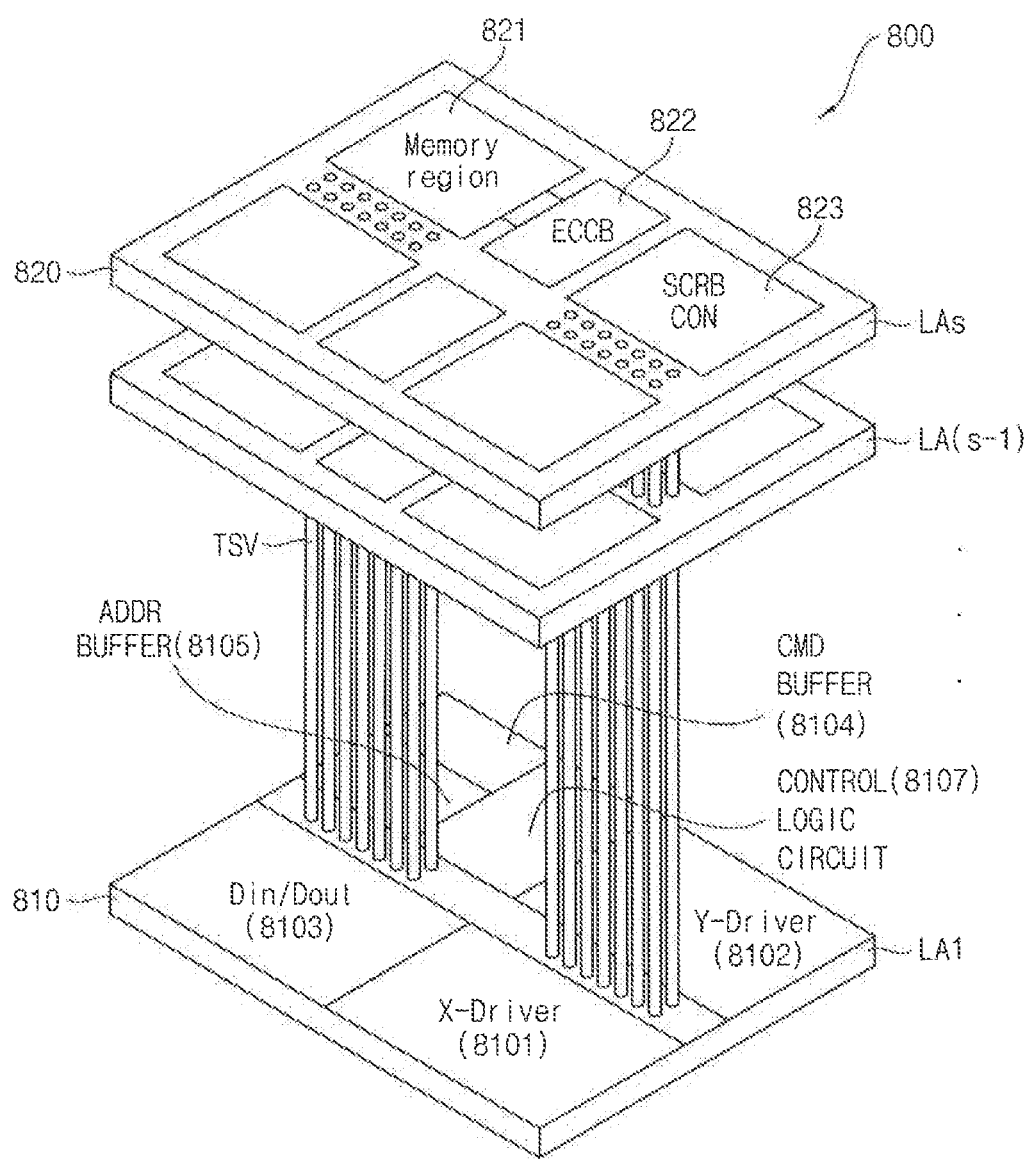
FIG. 24 is a structural diagram illustrating a semiconductor memory device according to exemplary embodiments of the inventive concept.

FIG. 24 is a structural diagram illustrating a semiconductor memory device according to exemplary embodiments of the inventive concept.

Referring to FIG. 24, a semiconductor memory device 800 may include first through s-th semiconductor integrated circuit layers LA1 through LAs (s is a natural number greater than two), in which the lowest first semiconductor integrated circuit layer LA1 is an interface or a control chip and the other semiconductor integrated circuit layers LA2 through LAs are slave chips including core memory chips. The first through s-th semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding a structure and an operation of the semiconductor memory device 800 by mainly using the first semiconductor integrated circuit layer LA1 or 810 as the interface or control chip and the s-th semiconductor integrated circuit layer LAs or 820 as the slave chip.

The first semiconductor integrated circuit layer 810 may include various peripheral circuits for driving a memory region 821 provided in the s-th semiconductor integrated circuit layer 820. For example, the first semiconductor integrated circuit layer 810 may include a row (X)-driver

8101 for driving word-lines of a memory, a column (Y)-driver 8102 for driving bit-lines of the memory, a data input/output unit (Din/Dout) 8103 for controlling input/output of data, a command buffer (CMD) 8104 for receiving a command CMD from outside and buffering the command CMD, and an address buffer (ADDR) 8105 for receiving an address and buffering the address.

The first semiconductor integrated circuit layer 810 may further include a control logic circuit 8107. The control logic circuit 8107 may access the memory region 821 and may generate control signals for accessing the memory region 821 based on the command from the memory controller.

The s-th semiconductor integrated circuit layer 820 may include the memory region 821, an ECC engine block 822 that performs ECC encoding and ECC decoding on data of the memory region 821, a scrubbing controller 823 that generates a scrubbing address or a weak codeword address in a scrubbing mode. The s-th semiconductor integrated circuit layer 820 may further include a peripheral region in which peripheral circuits such as a row decoder, a column decoder, and a bit-line sense amplifier are disposed for writing/reading data in the memory region 821.

As described with reference to FIGS. 3 through 23, the ECC engine block 822 and the scrubbing controller 823 sequentially perform the normal scrubbing operation on codewords in one bank array while performing a weak scrubbing operation on weak codewords in at least one of other bank arrays in response to the scrubbing command. Accordingly, the semiconductor memory device 800 may increase data reliability and increase performance.

In addition, in exemplary embodiments of the inventive concept, a three dimensional (3D) memory array is provided in the semiconductor memory device 800. The 3D memory array is monolithically formed in one or more physical levels of arrays of memory cells having an active area disposed above a silicon substrate and circuitry associated with the operation of those memory cells. The associated circuitry may be above or within the substrate. The term "monolithic" may mean that layers of each level of the array are directly deposited on the layers of each respective underlying level of the array. The following patent documents describe configurations for 3D memory arrays, in which a 3D memory array is configured as a plurality of levels, with word-lines and/or bit-lines shared between levels: U.S. Pat. Nos. 7,679,133; 8,553,466; 8,654,587; 8,559,235; and U.S. Pat. Application Pub. No. 2011/0233648. The aforementioned patent documents are incorporated by reference herein in their entireties.

Figure 25:
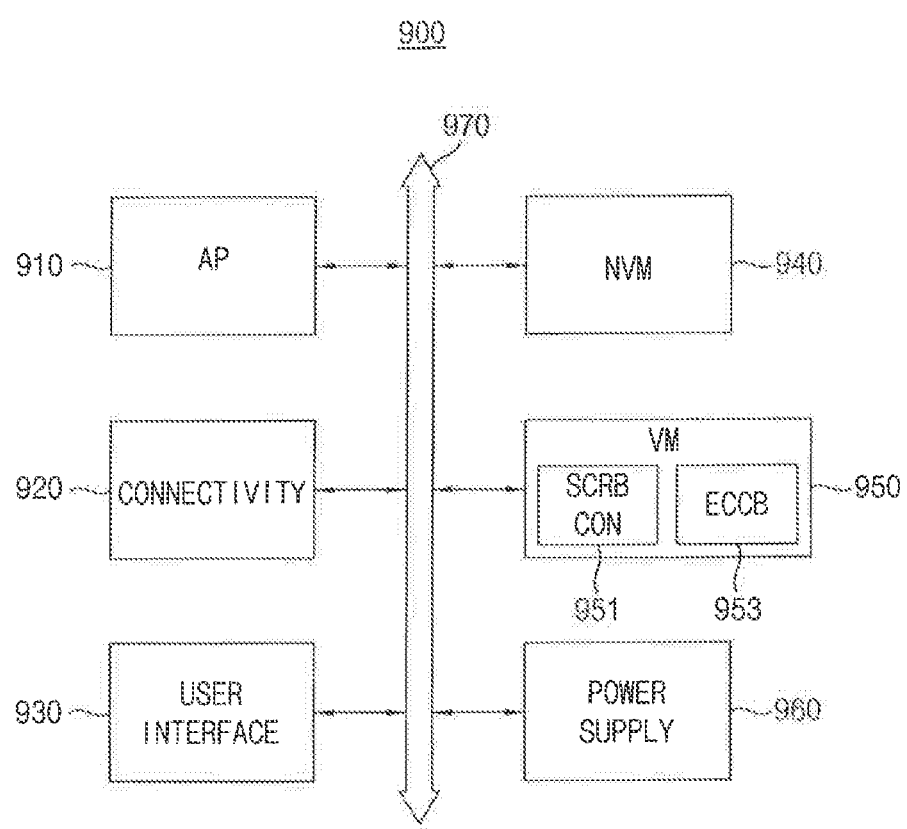
FIG. 25 is a block diagram illustrating a mobile system including the semiconductor memory device according to exemplary embodiments of the inventive concept.

FIG. 25 is a block diagram illustrating a mobile system including the semiconductor memory device according to exemplary embodiments of the inventive concept.

Referring to FIG. 25, a mobile system 900 may include an application processor 910, a connectivity unit 920, a volatile memory device 950, a nonvolatile memory device 940, a user interface 930 and a power supply 960 connected via a bus 970.

The application processor 910 may execute applications, such as a web browser, a game application, a video player, etc. The connectivity unit 920 may perform wired or wireless communication with an external device. The volatile memory device 950 may store data processed by the application processor 910 or operate as a working memory. The volatile memory device 950 may employ the semiconductor memory device 200a of FIG. 3. The volatile memory device 950 includes a scrubbing controller 951 and an ECC engine block 953.

The nonvolatile memory device 940 may store a boot image for booting the mobile device 900. The user interface 930 may include at least one input device, such as a keypad, a touch screen, etc., and at least one output device, such as a speaker, a display device, etc. The power supply 960 may supply a power supply voltage to the mobile system 900.

In exemplary embodiments of the inventive concept, the mobile system 900 and/or components of the mobile device 900 may be packaged in various forms.

Exemplary embodiments of the present inventive concept may be applied to systems using semiconductor memory devices. For example, exemplary embodiments of the present inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital television, a set-top box, a portable game console, a navigation system, or other such electronic devices.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A scrubbing controller of a semiconductor memory device, the scrubbing controller comprising:
   a scrubbing address generator configured to generate a scrubbing address for all codewords in a first bank array of a plurality of bank arrays in a first scrubbing mode, wherein the scrubbing address is associated with a normal scrubbing operation, and the scrubbing address changes in response to an internal scrubbing signal and a scrubbing command; and
   a weak codeword address generator configured to generate a weak codeword address for weak codewords in a second bank array of the plurality of bank arrays in a second scrubbing mode, wherein the weak codeword address is associated with a weak scrubbing operation and is generated in response to the internal scrubbing signal,
   wherein the weak scrubbing operation and the normal scrubbing operation are performed at the same time.

2. The scrubbing controller of claim 1, wherein the scrubbing address includes a scrubbing row address which designates a first page in the first bank array and a scrubbing column address which designates a first codeword in the first page, and wherein the scrubbing address generator comprises:
   a page segment counter configured to increase the scrubbing column address by one when the scrubbing command is applied in the first scrubbing mode; and
   a row counter configured to increase the scrubbing row address by one when the scrubbing column address reaches a predetermined value.

3. The scrubbing controller of claim 1, wherein the weak codeword address generator comprises:
   an address storing table configured to store address information of the weak codewords; and
   a table pointer configured to generate a pointer signal that identifies a location in the address storing table in response to the internal scrubbing signal.

4. The scrubbing controller of claim 3, wherein the address storing table is configured to output a row address and a column address of a weak codeword as a weak codeword row address and a weak codeword column address, when the pointer signal is applied to the address storing table in the second scrubbing mode, and wherein the weak codeword row address and the weak codeword column address are stored in the location identified by the pointer signal.

5. The scrubbing controller of claim 3, wherein the address storing table includes a nonvolatile storage.

6. A semiconductor memory device, comprising:
a memory cell array including a plurality of bank arrays;
a control logic circuit configured to control access to the memory cell array in response to a command and an address from an external memory controller;
a plurality of error correction code (ECC) engines corresponding to the plurality of bank arrays; and
a scrubbing controller including a plurality of scrubbing control engines corresponding to the plurality of bank arrays, respectively,
wherein the control logic circuit is configured to, in response to a scrubbing command provided from the memory controller, control the ECC engines and the scrubbing control engines such that a normal scrubbing operation is sequentially performed on all codewords in a first bank array of the plurality of bank arrays and a weak scrubbing operation is sequentially performed on weak codewords of a second bank array of the plurality of bank arrays except the first bank array, and
wherein the normal scrubbing operation and the weak scrubbing operation are performed at the same time.

7. The semiconductor memory device of claim 6, wherein at least one of the scrubbing control engines comprises:
a scrubbing address generator configured to generate a scrubbing address for all codewords in the first bank array in a first scrubbing mode, wherein the scrubbing address is associated with the normal scrubbing operation and the scrubbing address changes in response to an internal scrubbing signal which is enabled in synchronization with a reception time of the scrubbing command; and
a weak codeword address generator configured to generate a weak codeword address for weak codewords in the second bank array in a second scrubbing mode, wherein the weak codeword address is associated with the weak scrubbing operation and is generated in response to the internal scrubbing signal.

8. The semiconductor memory device of claim 7, wherein the scrubbing address includes a scrubbing row address which designates a first page in the first bank array and a scrubbing column address which designates a first codeword in the first page, and wherein the scrubbing address generator comprises:
a page segment counter configured to increase the scrubbing column address by one when the scrubbing command is applied in the first scrubbing mode; and
a row counter configured to increase the scrubbing row address by one when the scrubbing column address reaches a predetermined value.

9. The semiconductor memory device of claim 7, wherein the weak codeword address generator comprises:
an address storing table configured to store address information of the weak codewords; and
a table pointer configured to generate a pointer signal that identifies a location of the address storing table in response to the internal scrubbing signal.

10. The semiconductor memory device of claim 9, wherein the address storing table is configured to output a row address and a column address of a weak codeword as a weak codeword row address and a weak codeword column address, when the pointer signal is applied to the address storing table in the second scrubbing mode, and wherein the weak codeword row address and the weak codeword column address are stored in the location identified by the pointer signal.

11. The semiconductor memory device of claim 7, wherein in the first scrubbing mode, at least one of the ECC engines is configured to:
read a main data and a parity data in a codeword stored in a memory location designated by the scrubbing address;
detect an error bit in the main data based on the parity data;
correct the error bit based on the parity data; and
rewrite the corrected main data and the parity data in the memory location designated by the scrubbing address, or
rewrite data of a sub unit in which the error bit is corrected when the main data includes a first sub unit of data and a second sub unit of data.

12. The semiconductor memory device of claim 7, wherein in the second scrubbing mode, at least one of the ECC engines is configured to:
read a main data and a parity data in a codeword stored in a memory location designated by the weak codeword address;
detect an error bit in the main data based on the parity data;
correct the error bit based on the parity data; and
rewrite the corrected main data and the parity data in the memory location designated by the weak codeword address, or
rewrite data of a sub unit in which the error bit is corrected when the main data includes a first sub unit of data and a second sub unit of data.

13. The semiconductor memory device of claim 7, further comprising:
a disturbance detection circuit configured to count a number of accesses to a first memory region of the memory cell array and configured to generate at least one victim address of at least one neighbor memory region adjacent to the first memory region when the number of accesses reaches a reference value during a reference interval.

14. The semiconductor memory device of claim 13, wherein the disturbance detection circuit is configured to provide the at least one victim address to a scrubbing control engine corresponding to a bank array associated with the at least one victim address; and
wherein the scrubbing control engine is configured to store the at least one victim address as a weak codeword address.

15. The semiconductor memory device of claim 6, wherein the weak codeword address corresponds to an address associated with a page that includes error bits which are detected by an ECC decoding operation of at least one of the ECC engines, and a number of the error bits exceeds a reference value.

16. The semiconductor memory device of claim 6, wherein the control logic circuit is configured to control the ECC engines and the scrubbing control engines in response to the scrubbing command such that the normal scrubbing operation and the weak scrubbing operation are performed in units of the bank arrays.

17. The semiconductor memory device of claim 6, wherein the plurality of bank arrays are divided into a plurality of bank groups, each of the plurality of bank groups includes at least two bank arrays, and the control logic circuit is configured to control the ECC engines and the scrubbing control engines in response to the scrubbing command such that the normal scrubbing operation and the weak scrubbing operation are performed in units of the bank groups.

18. The semiconductor memory device of claim 6, wherein each of the plurality of bank arrays includes a plurality of memory cells coupled to word-lines and bit-lines, each of the plurality of memory cells includes a dynamic memory cell or a resistive type memory cell, and the memory cell array includes a three-dimensional memory cell array.

19. A scrubbing controller of a semiconductor memory device, the scrubbing controller comprising:

a scrubbing address generator configured to perform a normal scrubbing operation by generating a scrubbing address for a plurality of codewords in a first bank array of a plurality of bank arrays; and a weak codeword address generator configured to perform a weak scrubbing operating by generating a weak codeword address for a plurality of weak codewords in a second bank array of the plurality of bank arrays, wherein the normal scrubbing operation is performed on the codewords in the first bank array while the weak scrubbing operation is performed on the weak codewords in the second bank array.

20. The scrubbing controller of claim 19, wherein each of the scrubbing address and the weak codeword address is generated in response to an internal scrubbing signal and a scrubbing mode signal.

* * * * *